United States Patent [19]
Harford

[11] Patent Number: 5,305,109
[45] Date of Patent: Apr. 19, 1994

[54] PARALLEL UNTUNED VIDEO IF AMPLIFIERS SUPPLIED SIGNALS FROM TV 1ST DETECTOR VIA RESPECTIVE INPUT FILTERS

[75] Inventor: Jack R. Harford, Flemington, N.J.

[73] Assignee: Samsung Electronics Co., Ltd., Kyungki, Rep. of Korea

[21] Appl. No.: 80,705

[22] Filed: Jun. 24, 1993

Related U.S. Application Data

[63] Continuation-in-part of Ser. No. 940,220, Sep. 8, 1992.

[51] Int. Cl.[5] .......................... H04N 5/52; H04N 5/62
[52] U.S. Cl. ...................................... 348/737; 330/254; 455/242.2; 455/253.2; 348/707; 348/685
[58] Field of Search ............... 330/254; 358/179, 184, 358/197, 198; 455/234.1, 242.2, 247.1, 253.2; H04N 5/62, 5/52

[56] References Cited

U.S. PATENT DOCUMENTS

| | | | |
|---|---|---|---|
| 4,172,239 | 10/1979 | Harford | 358/179 |
| 4,531,097 | 7/1985 | Götz et al. | 330/354 |
| 4,718,086 | 1/1988 | Rumreich et al. | 380/20 |
| 4,974,087 | 11/1990 | Rumreich | 358/198 |

FOREIGN PATENT DOCUMENTS 2188501 9/1987 United Kingdom .......... H04N 5/52

Primary Examiner—Mark R. Powell
Assistant Examiner—Jeffrey S. Murrell
Attorney, Agent, or Firm—Sughrue, Mion, Zinn, Macpeak & Seas

[57] ABSTRACT

In TV receiving apparatus, a first IF amplifier chain comprises a first gain-controlled amplifier followed in cascade connection by a second gain-controlled amplifier, and a second IF amplifier chain comprises a third gain-controlled amplifier followed in cascade connection by a fourth gain-controlled amplifier. The second and fourth gain-controlled amplifiers are controlled similarly by an AGC signal, and the first and third gain-controlled amplifiers are controlled similarly by that AGC signal delayed in similar amounts. An RF amplifier is gain-controlled responsive to that AGC signal delayed even more, and a downconverter supplies first detector response to amplified RF, which first detector response is applied to the first and second IF amplifier chains by respective frequency-selective filters. The first IF amplifier response is downconverted to generate sound IF. The second IF amplifier response is detected to recover video signal. An AGC detector detects the peaks of the synchronizing pulses included in the video signal to develop the AGC signal.

18 Claims, 10 Drawing Sheets $V_{B2} > V_{B5} > V_{B4}$

PARALLEL UNTUNED VIDEO IF AMPLIFIERS
SUPPLIED SIGNALS FROM TV 1ST DETECTOR
VIA RESPECTIVE INPUT FILTERS

This is a continuation-in-part of U.S. patent application Ser. No. 07/940,220 filed Sep. 8, 1992.

FIELD OF THE INVENTION

The present invention relates to intermediate frequency (IF) amplifiers utilized in television signal receiving apparatus, such as television (TV) receivers and video cassette recorders (VCR's), which IF amplifiers follow the downconversion from radio frequency (RF) and are referred to as "video IF amplifiers" or "PIX IF amplifiers".

BACKGROUND OF THE INVENTION

The recent practice in regard to implementing the IF filtering and gain functions in television signal receiving apparatus is to use a lumped or "block" filter preceding a gain-block amplifier comprising plural stages arranged in direct-coupled cascade within the confines of a monolithic integrated circuit (IC). No interstage tuning is used. The amplified IF signal from the gain-block IC amplifier is further detected substantially within the confines of the monolithic integrated circuit, to emerge from the IC as baseband composite video signal and as sound IF at 4.5 MHz. The amplified IF signal is filtered from these signals to reduce the likelihood of regeneration causing the gain-block amplifier to oscillate.

The "block" filter is commonly a surface-acoustic-wave (SAW) filter used to provide the entire passband shape and adjacent channel attenuation required by a television receiver. Additional information on SAW filters and on block filtering and amplification may be found, for example, in Chapter 13 of the book TELEVISION ENGINEERING HANDBOOK; K. Blair Benson, Editor in Chief; McGraw-Hill Book Company, New York; 1986.

There are conflicting requirements on video IF amplification inasfar as best picture reception and best sound reception are concerned, which conflicting requirements are more difficult to resolve when a block filter preceding a gain-block amplifier is used to provide IF amplification. Good picture reception, with full resolution capability in the direction of horizontal sweep, requires that the IF signal as supplied to the video detector does not include response to in-channel sound carrier. Accordingly, in television signal receiving apparatus using discrete amplifying devices with interstage tuning, an in-channel sound trap commonly precedes the video detector. Good picture reception further requires that the IF signal as supplied to the video detector does not include response to adjacent-channel sound carrier, which response intrudes "sound beats" into the picture. In television signal receiving apparatus using discrete amplifying devices with interstage tuning, an adjacent-channel sound trap precedes the video detector and provided high (40 dB or so) rejection over the band in which the adjacent-channel sound signal as translated to IF appeared. To obtain such rejection and still maintain acceptably linear phase response for composite video, the video carrier as translated to an IF has to be located on the edge of the adjacent-channel sound trap rejection response, and is normally attenuated 6 dB or so. When a block filter preceding a gain-block amplifier is used to provide IF amplification, the traps for adjacent-channel and in-channel sound have to be provided within the block filter preceding the gain-block amplifier providing amplified IF for direct coupling to the video detector, which can be used for the generation of intercarrier sound.

Sound reception in a TV receiver using intercarrier sound exhibits better signal-to-noise ratio, however, when the sound and video carriers as translated to IF are not attenuated respective to mid-band prior to their being mixed together to generated 4.5 MHz sound IF signal. To achieve better sound reception while adhering to the design concept of block filtering, a further block filter and gain-block amplifier cascade is used for intercarrier sound in the invention, in addition to the block filter and gain-block amplifier cascade used to drive the video detector. The two gain-block amplifiers are preferably constructed in substantially the same way within the confines of the same monolithic IC, the inventor points out, such that their operating characteristics track each other. Preferably each of the gain block amplifiers has a balanced conversion stage cascaded thereafter within the IC, so the frequency of its output signal as supplied from the IC differs from the frequency of its input signal as supplied to the IC. This reduces the risk of the gain block amplifier regeneratively oscillating. To further reduce the risk of regenerative interaction between the two gain-block amplifiers, one gain-block amplifier can provide balanced output signals responsive to single-ended input signal, and the other gain-block amplifier can provide single-ended output signal responsive to single-ended input signals. The tracking of the gain-control characteristics of the two gain-block amplifiers is particularly important, since it allows an automatic gain control signal developed by detecting the tips of synchronizing pulses from the video detector cascaded after one of the two gain-block amplifiers to be applied in parallel to both the gain-block amplifiers for controlling their gains similarly.

In television signal receiving apparatus of the type having only a single conversion before video detection, the IF amplifier is typically required to handle input signals ranging from about 50 microvolts to about 100 millivolts RMS, which represents a dynamic range of about 66 dB. U.S. patent application Ser. No. 07/940,220 filed Sep. 8, 1992 by Jack Rudolph Harford and Heung Bae Lee, entitled VARIABLE GAIN AMPLIFIER, describes gain-block stages suitable for use in the invention herein described and claimed. As is the case in the present application, U.S. patent application Ser. No. 07/940,220 has been assigned to Samsung Electronics co., Ltd., pursuant to obligations of the inventor(s) to assign his (their) invention(s) at the time the inventions were made. In these gain-block stages a 66 dB range of gain control can be achieved using only two gain-controlled voltage amplifier stages, which facilitates the tracking of the gain-control characteristics of the two gain-block amplifiers.

SUMMARY OF THE INVENTION

Television signal receiving apparatus embodying the invention is characterized by a first IF amplifier chain and a second IF amplifier chain, parallelly operated. The first IF amplifier chain comprises a first gain-controlled amplifier followed in cascade connection by a second gain-controlled amplifier; and the second IF amplifier chain comprises a third gain-controlled amplifier followed in cascade connection by a fourth gain-controlled amplifier. The first and third gain-controlled amplifiers each exhibit a respective voltage gain adjustable in response to a respective control signal thereof and are similar to each other in structure and in gain control characteristics. The second and fourth gain-controlled amplifiers each exhibit a respective voltage gain adjustable in response to a respective control signal thereof and are are similar to each other in structure and in gain control characteristics. An automatic gain control signal is applied to the second and fourth gain-controlled amplifiers as their respective control signals, and that automatic gain control signal delayed in similar amounts is applied to the first and third gain-controlled amplifiers as their said respective control signals.

The television signal received by the radio-frequency amplifier has a radio-frequency picture carrier wave with an amplitude-modulation sideband and has a radio-frequency sound carrier wave with frequency-modulation sidebands, and the radio-frequency amplifier is gain-controlled responsive to a respective control signal provided by delaying the automatic gain control signal. A downconverter is included in the receiving apparatus for generating an intermediate-frequency response to the television signal as amplified by the radio-frequency amplifier. Means are included in the receiving apparatus for filtering the intermediate-frequency response to said television signal to separate therefrom the intermediate-frequency response to the portions of said television signal consisting of the sound carrier wave and its frequency-modulation sidebands for application to the first IF amplifier chain. Means are included in the receiving apparatus for filtering the intermediate-frequency response to said television signal to separate therefrom the intermediate-frequency response to the portions of said television signal consisting of said picture carrier wave and its amplitude-modulation sideband for application to the second IF amplifier chain.

Means are provided for further down-converting the amplified intermediate-frequency response to the portions of the television signal essentially consisting of the sound carrier wave and its frequency-modulation sidebands, as supplied from the first IF amplifier chain, to generate a sound intermediate frequency response. The sound-descriptive information contained in the frequency modulation of the sound intermediate frequency response is detected. The means for detecting sound-descriptive information include means for suppressing response of that means for detecting sound-descriptive information to variations in the amplitude of the sound intermediate frequency response.

A video detector detects the amplified intermediate-frequency response to the portions of said television signal essentially consisting of said picture carrier wave and its amplitude-modulation sideband, as supplied from the second IF amplifier chain, to generate a video signal including synchronizing pulses. An AGC detector detects the peaks of the synchronizing pulses included in the video signal to develop the automatic gain control signal applied to the second and fourth gain-controlled amplifiers as their respective control signals.

DETAILED DESCRIPTION

Figure 1:
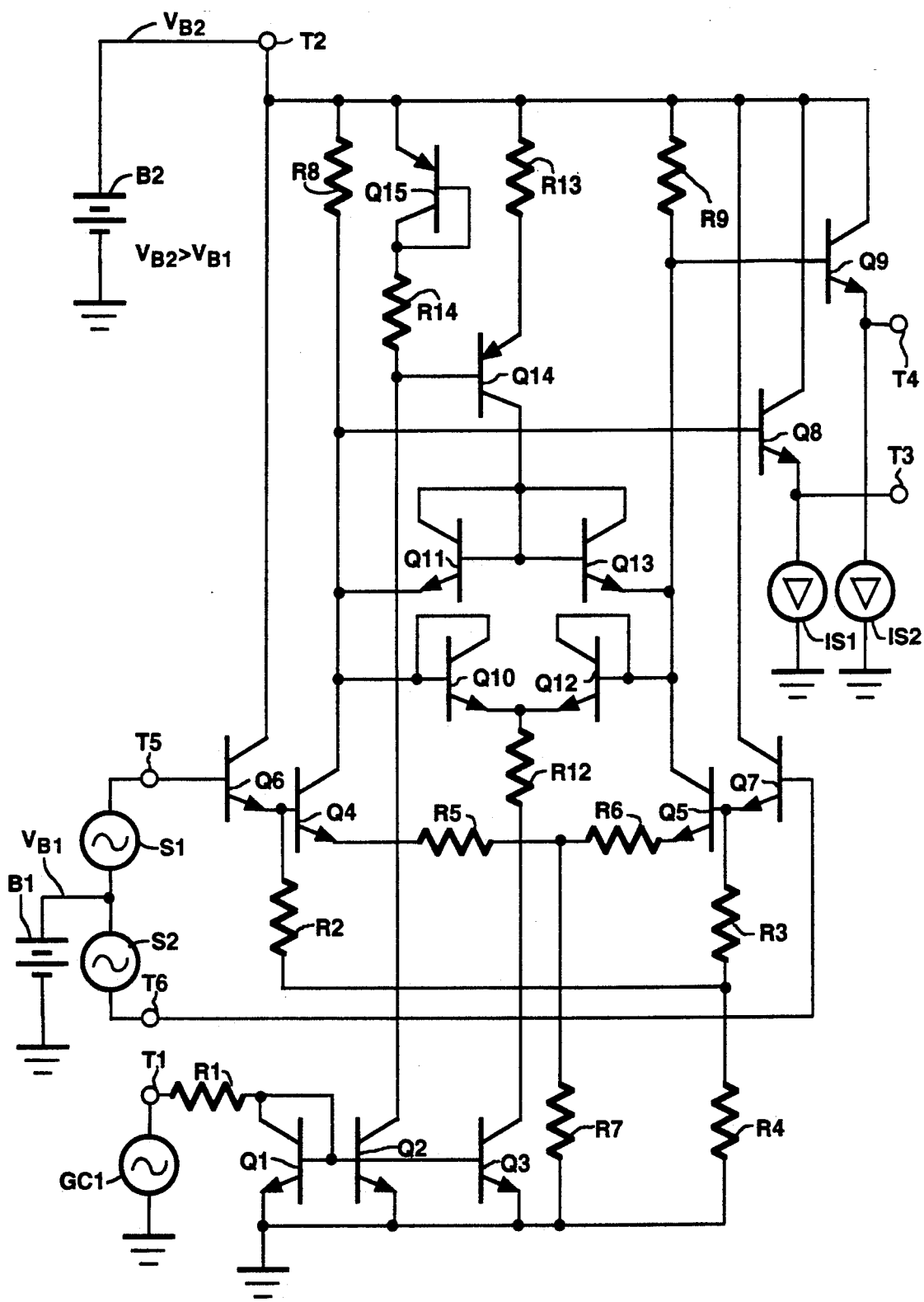
FIG. 1 is a schematic diagram of a gain-controlled amplifier stage that is particularly well-suited for use as the first stage of a plural-stage IF amplifier and is also disclosed by the inventor and another in U.S. patent application Ser. No. 07/940,220 filed Sep. 8, 1992.

Within this specification the term "RF signal" shall be used in reference to signals at points in a television receiver before the down-conversion, or first detection; and the term "IF signal" shall be used in reference to signals at points in a television receiver after the down-conversion, or first detection, and before video detection, or second detection. In television receivers a down-conversion is carried out by heterodyning the incoming radio-frequency (RF) signals of different transmission channels with the oscillations of a tunable-frequency oscillator, thereby to generate lower-in-frequency radio-frequency signals within an intermediate-frequency (IF) band which is selected and amplified in an intermediate-frequency (IF) amplifier.

An intermediate-frequency amplifier used for further amplifying the intercarrier sound signal after its detection is commonly termed a "sound IF amplifier". To avoid confusion, this specification will use the term "video IF amplifier" only to refer to the IF amplifier used to supply input signal to the sound detector generating the intercarrier sound signal and will use the term "PIX IF amplifier" only to refer to the "video IF amplifier" used to supply input signal to the video detector generating a composite video signal. The term "IF amplifier" will be a generic term referring to either a "video IF amplifier" or to a "PIX IF amplifier", but not to a "sound IF amplifier".

In providing an automatic gain control (AGC) function, it is desirable that certain operating conditions be met for each amplifier stage or device. Thus, the input signal level should exceed the internal noise by a predetermined factor, and the input signal level should not overload the device and thereby cause signal distortion and a bias shift. Furthermore, the AGC control signal should not itself cause undesirable bias shifts and thereby cause devices to be shifted from their intended operating points. E. g., the operating points for amplifiers and mixers are chosen to provide for low distortion in their output signals, and the operating points for mixers and detectors are chosen to provide for relatively high second-order responses.

At relatively strong signal levels in the order of 1 millivolt or more, it is particularly important that the gain be controlled in a manner that takes into account the so-called "noise/overload window". If, on the one hand, the gain of an earlier stage of a multiple-stage amplifier is reduced too little, overload with distortion undesirably may occur in a later stage. If, on the other hand, if the gain in an earlier stage is too low, thermal noise may become noticeable. It is desirable that a substantially noise-free and undistorted picture be achievable for an input signal level corresponding to 10 millivolts or so, measured at typical impedance levels. If an amplifier exhibits an inadequate noise/overload window, it may contribute noise or overload distortion at signal levels where a low distortion, relatively noise-free picture should be possible.

While the advent of block filtering and amplification has been generally desirable in the TV receiver art, it has nevertheless aggravated the problem of the noise/overload window for a number of reasons. Typical commercially available SAW filters used as a lumped filter at the input of an IF amplifier exhibit high insertion loss and high impedance, thereby acting as a relatively high level noise source impedance. The noise margin side of the noise/overload window is thereby reduced. Furthermore, noise signals falling within ±4.5 MHz of the picture carrier will be demodulated as noise that is "folded" into the 0–4.5 MHz video band. This arises as follows. The IF signal lies within the band of 41.25–45.75 MHz. With the use of lumped or block filtering at the input of an IF amplifier, the sideband noise of IF stages following the filter is not suppressed as was the case when filtering was distributed stage by stage. This is because the noise within the band of ±4.5 MHz centered about the (IF) picture carrier frequency of 45.75 MHz is not filtered by the lumped filter ahead of the amplifier.

Another effect which tends to aggravate the noise/overload window problem in the block filtering and amplification procedure is that the typical bipolar IC amplifier utilized exhibits a transfer characteristic having a fixed overload voltage level, which restricts the overload side of the noise/overload window. Furthermore, typical modern small geometry bipolar transistors tend to exhibit a high base access resistance ($r_b$) and hence tend to have a worse noise figure than larger, optimized devices having low $r_b$; this aggravates the problem. The noise/overload window can be extended on the overload side by utilizing transistors of different design and, on the noise side by transforming the SAW filter output impedance to a lower value, thereby reducing its contribution as a noise source. However, impedance matching arrangements such as transformers or other matching circuits are costly, bulky, and raise the gain requirements on a system that already has high gain.

The problem of the noise/overload window is further complicated by the fact that each of certain ones of prior-art gain-controlled IF amplifiers exhibits a shift of its output bias voltage as a function of gain control. Generally, this results in a change of bias voltage on the demodulator, which is typically direct-coupled to the IF amplifier. As was mentioned above with regard to operating points, such change is undesirable. As a result of the shifting bias conditions, adequate bias voltage must be provided to accommodate the changes, thereby complicating the demodulator design and necessitating a higher supply voltage than is otherwise required for low distortion.

A basic amplifier stage that is often used in IF amplifiers is the long-tailed pair or emitter-coupled differential amplifier, which includes two transistors with a "tail" connection between their emitter electrodes to which a constant current generator connects. The constant current generator may be provided by a high-resistance resistor between the tail connection and a remote direct potential; but in ICs, where there is a desire to use smaller operating potentials in order to keep dissipation within acceptable bounds, the constant current generator is generally provided by the principal conduction path of another transistor biased for constant current operation. While the long-tailed pair is oftentimes referred to as an emitter-coupled "differential" amplifier, in fact, it is often operated with a single-ended input circuit, a single-ended output circuit, or both. Gain control may be effected by the straight-forward reduction of the operating or tail current of an emitter-coupled differential amplifier, thereby reducing its mutual conduction in a known manner. However, there are drawbacks to the simple application of this approach. First, the noise source resistance is increased as gain decreases, thereby negating to an extent the improved signal-to-noise ratio associated with a larger signal and second, the power handling capability is reduced when it is most needed to handle a larger signal.

Prior-art untuned amplifiers, constructed in IC form and used after block filtering for television-receiver IF amplification in commercially successful TV receiver designs, have used three successive gain-controlled stages in order to meet the dynamic range requirements of about 66 dB for such service. These designs have used reverse AGC, in which the transconductances of the amplifier transistors are reduced in order to effect gain reduction. The voltage gain of an undegenerated common-emitter transistor amplifier is $g_m R_L$, where $g_m$ is the transconductance of the transistor and $R_L$ is the resistance of the collector load used with the transistor. The reduction of the transconductances of the amplifier transistors raises the resistances of the noise sources presented to their collector electrodes, increasing thermal noise generated by the transistors and thus making it necessary to use three successive gain-controlled stages in order to keep the overall noise figure for the PIX IF amplifier chain low enough to meet commercial requirements. An alternative approach for reducing the gains of cascaded amplifier stages is to reduce the collector resistances used with the transistors, the well-known forward AGC being an example of this approach. If the transconductances of the transistors are not reduced, there is no attendant increase in thermal noise generated by the transistors; and reducing the collector resistances used with the transistors reduces the voltages associated with the currents generated by their thermal noise.

In U.S. patent application Ser. No. 07/940,220 J. R. Harford and H. B. Lee describe arrangements to reduce the collector resistances used with emitter-coupled differential-amplifier transistors by shunting those collector resistances with devices having electrically controlled conductances. Each of the gain-controlled IF amplifiers J. R. Harford and H. B. Lee describe exhibits very little shift of its output bias voltage as a function of gain control. Three-stage IF amplifiers using these gain-controlled IF amplifiers in their first and second voltage-gain stages are suitable for use with direct-coupled DC feedback loops that reduce the difference between the direct bias potentials on which the balanced IF output signals are superposed. Since these gain-controlled IF amplifiers exhibit very little shift of their output bias voltages as a function of gain control, the direct-coupled DC feedback loops that reduce the difference between the direct bias potentials on which the balanced IF output signals are superposed can be differential-mode in nature and need not correct the common-mode values of these direct bias potentials.

Since the third voltage-gain stage has a fixed voltage gain of twentyfold or so, even when the gain of the second voltage-gain stage is reduced by AGC, sufficient differential-mode feedback loop gain is available to suppress adequately the difference between the direct bias potentials on which the balanced IF output signals are superposed, even though the differential-mode feedback loop does not include the first gain-controlled IF amplifier therewithin. As the gain of the second voltage-gain stage is reduced by AGC before the gain of the first voltage-gain stage is reduced by delayed AGC, there is a reduction in similar degree of the difference between the direct bias potentials on which the balanced IF output signals are superposed, inasfar as that difference is attributable to imbalance in the first gain-controlled IF amplifier. Furthermore, the difference between the direct bias potentials on which the balanced IF output signals are superposed that is attributable to imbalance in the second gain-controlled IF amplifier is likely to be reduced as well.

As the gain of the first voltage-gain stage is reduced by delayed AGC, the difference between the direct bias potentials on which the balanced IF output signals are superposed that is attributable to to imbalance in the first gain-controlled IF amplifier is likely to be further reduced. So, modest further reduction of the gain in the second gain-controlled IF amplifier during the application of delayed AGC to the first gain-controlled IF amplifier can be tolerated, inasfar as keeping the difference between the direct bias potentials on which the balanced IF output signals are superposed within acceptable limit.

Including only the second gain-controlled IF amplifiers of each of parallelly AGC'd IF amplifier chains, in the respective differential-mode feedback loops for correcting direct potential imbalances in their amplified IF signals, tends to facilitate tracking the respective gains of these AGC'd IF amplifier chains. There is no AGC delay break in the gain control characteristic of the amplifiers within either of the feedback loops, to have to take into account in determining loop behavior.

Referring to FIG. 1, Q1 is a bipolar transistor, having a base electrode for controlling conduction through a principal conduction path between emitter and collector electrodes, as is also the case with other bipolar transistors to be hereinafter referred to in the description. An NPN transistor Q1 has its base and collector electrodes conductively joined so as to operate in a diode-connected mode. The emitter electrode of Q1 connects to a source of a reference potential, here shown as ground. A reference current is supplied to the joined base and collector electrodes via a resistance R1 having one end thereof connected to those joined electrodes and having another end thereof connected to receive a automatic-gain-control (AGC) signal potential applied at a terminal T1. FIG. 1 shows the AGC signal potential originating from a generator GC1 being applied at a terminal T1.

NPN transistors Q2 and Q3 have their respective emitter electrodes connected to the same reference potential as the emitter electrode of Q1 and their base electrodes connected to the base electrode of Q1, so as to form a current mirror arrangement with respect to the reference current supplied via R1. The emitter electrodes of NPN transistors Q4 and Q5 are each connected to one end of respective resistances R5 and R6 whose other ends are connected together and are connected to a point at ground reference potential via a series resistance R7, so that transistors Q4 and Q5 form a differential pair, with resistance R7 supplying operating current or tail current to the differential pair.

The base electrodes of NPN transistors Q6 and Q7 are connected to respective signal input terminals T5 and T6 for receiving a differential input signal and accompanying direct bias potential thereat. FIG. 1 shows a battery B1 with its negative terminal connected to a point of ground reference potential supplying a positive direct bias potential V at its positive terminal against which are referred balanced input signals supplied by generators S1 and S2 to the base electrodes of Q6 and Q7. Transistors Q6 and Q7 are connected as common-collector amplifiers to provide voltage followers of the emitter-follower type. Their respective emitter electrodes connect to respective ones of the base electrodes of Q4 and Q5 and to one end of respective resistances R2 and R3. The other ends of R2 and R3 are connected together and to one end of a resistance R4 whose other end is connected to ground. Transistors Q6 and Q7 have their collector electrodes connected to receive a positive operating potential $V_{B2}$ applied to a supply terminal T2, shown in FIG. 1 as being supplied from the positive terminal of a battery B2 having its negative terminal connected to a point at reference ground potential.

The collector electrodes of Q4 and Q5 are connected to supply terminal T2 via respective series resistances R8 and R9. The collector electrode of Q4 is further connected to the base electrode of an NPN transistor Q8, the collector electrode of which connects to T2. The emitter electrode of Q8 is connected to an output terminal T3, and a current source IS1 drains current therefrom to a point of ground reference potential. The collector electrode of transistor Q5 is further connected to the base electrode of an NPN transistor Q9, the collector electrode of which connects to T2. The emitter electrode of Q9 is connected to an output terminal T4, and a current source IS2 drains current therefrom to a point of ground reference potential. Q8 and Q9 function as voltage followers of emitter-follower type for the balanced output voltages developed by the FIG. 1 controlled-gain amplifier.

The collector electrode of transistor Q4 is further connected to the joined collector and base electrodes of an NPN transistor Q10 and to the emitter electrode of an NPN transistor Q11. The collector electrode of transistor Q5 is further connected to the joined collector and base electrodes of an NPN transistor Q12 and to the emitter electrode of an NPN transistor Q13. The joined emitter electrodes of transistors Q10 and Q12 are connected to the collector electrode of transistor Q3 via a series resistance R12. The joined collector and base electrodes of transistors Q11 and Q13 are connected to the collector electrode of a PNP transistor Q14, the emitter electrode of which is connected to supply terminal T2 via a series resistance R13. The base electrode of transistor Q14 is connected to the collector electrode of Q2 and is further connected via a series resistance R14 to the base and collector electrodes of a PNP transistor Q15. The emitter electrode of diode-connected transistor Q15 is connected to supply terminal T2.

In operation, diode-connected transistors Q10, Q11, Q12, and Q13, in conjunction with resistors R8 and R9, form a variable load for the collector electrodes of the emitter-coupled differential amplifier transistor Q4 and Q5. The output signal is buffered by Q8 and Q9 operating as voltage followers of the emitter-follower type. The DC through diode-connected transistors Q10, Q11, Q12, and Q13 is determined by the current mirror output current in the collector electrode of Q3 and in the equal collector current of Q2, as thereafter mirrored by the current mirror formed by PNP transistors Q14 and Q15. When these currents are zero, as will occur when the current in resistance R1 is zero, diode-connected transistors Q10, Q11, Q12, and Q13 present high impedances. Consequently, the amplifier gain as determined by the gain of the differential pair amplifier is at a maximum, being defined by the collector resistors.

When current is applied to diode-connected transistors Q10, Q11, Q12, and Q13, responsive to increasing the positive potential at terminal T1, their impedance becomes relatively low and the gain of the emitter-coupled differential amplifier comprising Q4 and Q5 is reduced. The collector electrodes of transistors Q3 and Q14 source and sink closely equal currents so that the same current enters as leaves the network comprising diode-connected transistors Q10, Q11, Q12, and Q13. Under this condition, no current is added to or removed from the collector electrode nodes of Q4 and Q5. Thus, if diode-connected transistors Q10, Q11, Q12, and Q13, and the transistors supplying current to them are well matched, there will be no disturbance of the DC conditions of operation of the amplifier as the gain is changed. Such matching is readily accomplished on a monolithic IC. Furthermore, the network comprising diode-connected transistors Q10, Q11, Q12, and Q13 is in the form of a bridge, so that the nodes where currents are supplied to the network are at AC ground, forming a "virtual ground" for RF currents. One result of this is that the PNP transistor Q14 carries only DC and its collector capacitance does not affect the frequency response of the amplifier. Another effect is that there is no signal return to ground through the diode-connected transistors Q10, Q11, Q12, and Q13. The gain control variable elements are in the collector circuit of the differential pair amplifier, allowing design freedom in biasing the emitter circuit for large signal handling capability and so extending the overload characteristic. Furthermore, the power required to effect gain control is limited.

In the FIG. 1 amplifier stage the collector loads of the emitter-coupled differential amplifier are just the resistive loads at maximum gain, since the diodes used to shunt them are non-conducting under this condition. The use of resistances as collector loads is advantageous in that: the maximum voltage gain of each stage can be predicted, despite the construction of the gain-controlled amplifier in an IC, and this permits gain-controlled amplifier stages to be mass-produced in IC form without the need for individual adjustment of each amplifier stage in regard to maximum voltage gain. The maximum voltage gain of each amplifier stage is the product of the transconductance ($g_m$) of an emitter-coupled differential-amplifier transistor times the resistance ($R_L$) of its collector load. The $g_m$ of the transistor is determined by its emitter current flow, which current flow is made proportional to a applied bias voltage $V_{BIAS}$ (less, typically, a semiconductor junction offset voltage $V_{BE}$) applied across a resistive element with resistance $R_{BIAS}$ included on the IC with the resistive loads and arranged to be of the same type as the resistive loads. That is, the emitter current flow of the emitter-coupled differential-amplifier transistor is made to track a bias current $I_{BIAS}=(V_{BIAS}-V_{BE})/R_{BIAS}$, so its maximum voltage gain, $g_m R_L$, is proportional to $[(V_{BIAS}-V_{BE})/R_{BIAS}]R_L=(V_{BIAS}-V_{BE})(R_L/R_{BIAS})$. Since ($R_L/R_{BIAS}$) is the ratio of on-chip resistive elements, the value of this ratio is very well defined and can be accurately predicted. The few millivolt variation of $V_{BE}$ with temperature is usually negligible compared to ($V_{BIAS}-V_{BE}$), a voltage which depends on the bias voltage $V_{BIAS}$ applied from off-chip and can be arranged to have a well-predicted value. The value of $R_L$ is normally chosen to provide a maximum voltage gain of about twenty times for a controlled-gain amplifier stage.

The first stage of a PIX IF amplifier has to accommodate the full dynamic range of differential IF input potential signal to the amplifier, the amplitude of the IF signal supplied to the later stage(s) of the PIX IF amplifier being subject to a lesser dynamic range of input signal level owing to the gain control afforded by the first stage. The first stage of a PIX IF amplifier has to have the capability of avoiding overload on the peaks of the largest differential IF input signals received during strong-signal reception, when the gain control of the preceding RF amplifier runs out of range. The FIG. 1 gain-controlled amplifier is fitted for use as the first stage of a PIX IF amplifier, with the differential amplifier transistors Q4 and Q5 being emitter-coupled with substantial differential-mode resistance between their emitter electrodes. The linear differential-mode resistance provided by the resistors R5 and R6 permits the differential IF input signal potential between their base electrodes to reach as high about 100 millivolts RMS without either transistor being cut off on signal peaks. The differential-mode resistance between the emitter electrodes of transistors Q4 and Q5 can be provided in other known ways—e.g., by the resistance of the resistor R81 in the FIG. 8 pi network replacement for the FIG. 1 tee network connection of resistors R5, R6 and R7; by the resistance of a resistor corresponding to resistor R81 in another pi network that is a modification of the FIG. 8 pi network, in which other pi network transistors biased for constant-current-source operation replace the resistors R62 and R63; and by the combined resistances of the resistors R5 and R6 in a modification of the FIG. 1 tee network connection of resistors R5, R6 and R7 in which a transistor biased for constant-current-source operation replaces the resistor R7.

Figure 2:
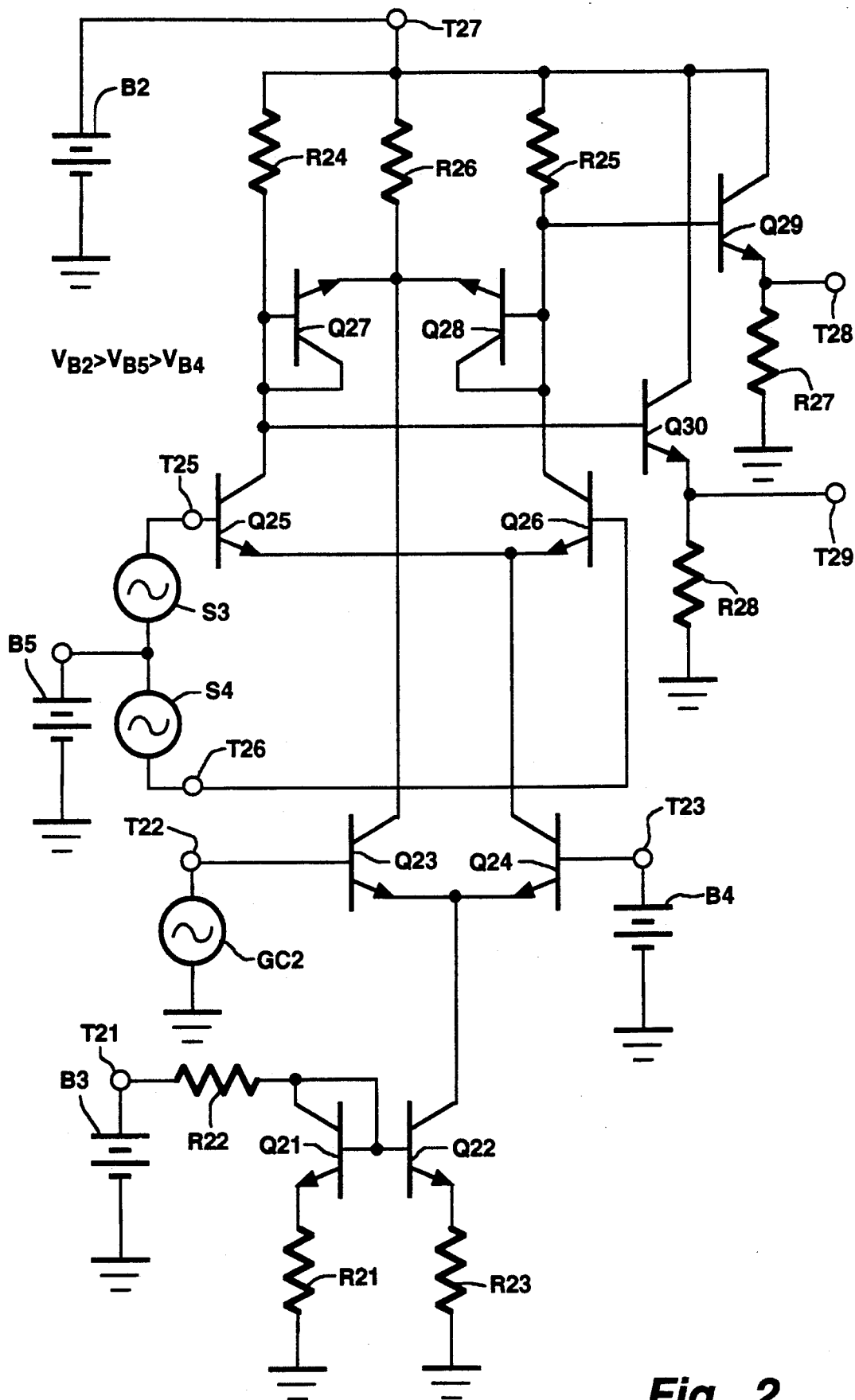
FIG. 2 is a schematic diagram of a gain-controlled amplifier stage that is particularly well-suited for use as the second stage of a plural-stage IF amplifier and is also disclosed by the inventor and another in U.S. patent application Ser. No. 07/940,220 filed Sep. 8, 1992.

In the FIG. 2 gain-controlled amplifier, a transistor Q21 is of NPN conductivity type and has its base and collector electrodes conductively joined so as to operate in a diode-connected mode. The emitter electrode of Q21 is connected via a series resistance R21 to a source of a reference potential, here shown as ground. A reference current is supplied to the joined base and collector electrodes via a resistance R22 having one end thereof connected thereto and another end thereof connected to receive a positive direct bias potential $V_{B3}$ applied to a terminal T21. FIG. 2 shows $V_{B3}$ as being supplied from a battery B3.

An NPN transistor Q22 has its emitter electrode connected to ground via a series resistance R23 and its base electrode connected to the base electrode of transistor Q21, so as to form a current mirror arrangement with respect to the reference current supplied via R22. NPN transistors Q23 and Q24 form a differential amplifier pair, having their respective emitter electrodes connected to the collector electrode of transistor Q22. The base electrode of transistor Q23 is connected to a terminal T22 for receiving a gain control signal thereat, herein represented as being supplied by a source GC2, and the base electrode of transistor Q24 is connected to a terminal T23 for receiving a positive direct bias potential $V_{B4}$ thereat, herein represented as being supplied by a battery B4.

NPN transistors Q25 and Q26 form a differential amplifier pair wherein their emitter electrodes are connected to the collector electrode of transistor Q24. Their base electrodes are connected to respective input terminals T25 and T26 for receiving a balanced input signal referred to a direct bias potential. FIG. 2 shows a battery B5 with its negative terminal connected to a point of ground reference potential supplying a direct bias potential $V_{B5}$ at its positive terminal against which are referred balanced input signals supplied by generators S3 and S4 to the terminals T25 and T26. The collector electrodes of transistors Q25 and Q26 are connected via respective resistances R24 and R25 to a supply terminal T27 for receiving a positive operating potential $V_{B2}$, shown as being supplied from the battery B2. The collector electrode of transistor Q25 is further connected to the joined collector and base electrodes of an NPN transistor Q27 and the collector electrode of transistor Q26 is further connected to the joined collector and base electrodes of an NPN transistor Q28. The joined emitter electrodes of Q27 and Q28 are connected to the collector electrode of transistor Q23 and are further connected to terminal T27 by a resistance R26. NPN transistors Q29 and Q30 are arranged as voltage followers of the emitter-follower type, which serve as output buffer stages. The base electrodes of Q29 and Q30 connect to the collector electrodes of Q26 and Q25, respectively, and the collector electrodes of Q29 and Q30 connect to supply terminal T27. The emitter electrode of transistor Q29 is connected to an output signal terminal T28 and to one end of a resistance R27 the other end of which is connected to ground. The emitter electrode of transistor Q30 is connected to an output signal terminal T29 and to one end of a resistance R28 the other end of which is connected to ground.

In operation, current from the current mirror output at the collector electrode of transistor Q22 is steered by the transistor pair Q23 and Q24, between providing tail current for the differential-amplifier transistors Q25 and Q26 on the one hand, and providing bias current for diode-connected transistors Q27 and Q28, on the other hand. When the diode-connected transistors Q27 and Q28 carry no current, the gain is at its maximum value, being determined by maximum tail current and by the collector load resistances R24 and R25. When the AGC potential GC2 is made positive enough to bias transistor Q23 into conduction, the diode-connected transistors Q27 and Q28 are biased into conduction to shunt the collector resistances R24 and R25 of the transistors Q25 and Q26 to reduce their gain. At the same time the conduction of transistor Q23 reduces the current available for flow through Q24 and as tail current for the transistors Q25 and Q26, which reduced tail current operates them at reduced transconductance and thus reduces their gain further. In any event, the DC through each of resistances R24 and R25 is not disturbed by the operation of gain control. However, when more than half of the operating tail current for the differential amplifier pair is steered into the diode-connected transistors Q27 and Q28, noise performance will start to degrade. This is because of the poorer noise figures of the transistors Q25 and Q26 as their internal emitter resistances increase responsive to reduced current conduction by the principal conduction path of transistor Q24. Accordingly, the reduction of stage gain by the shunting of the collector load resistances R24 and R25 by diode-connected transistors Q27 and Q28 is the mechanism for gain reduction principally relied on, rather than reduction of the transconductances of Q25 and Q26 through starvation of their tail current. The normal range of gain control is upward from about 0 dB, then, to 26 dB or so.

The FIG. 2 gain-controlled amplifier is not particularly well-suited for use as the initial stage of a plural-stage IF amplifier, because it will overload rather quickly on overlarge input signals. Since the FIG. 2 gain-controlled amplifier relies more on diode shunting of the collector loads of the emitter-coupled transistors Q25 and Q26 than on reduction of their transconductances through starvation of their tail current, this shortcoming can be appreciably overcome by including emitter degeneration resistances for the transistors Q25 and Q26 in their emitter coupling. The modified stage still does not perform quite so well as the first stage of an IF amplifier as does either the FIG. 1 or FIG. 4 gain-controlled amplifier, because of the above-noted problem of noise figure being degraded as gain is cut back below 0 dB. In the later stage(s) of an IF amplifier, however, where the dynamic range of input signal to the stage(s) is reduced, the simpler construction of the FIG. 2 gain-controlled amplifier makes it the favored choice over the FIG. 1 or FIG. 4 gain-controlled amplifier.

Figure 3:
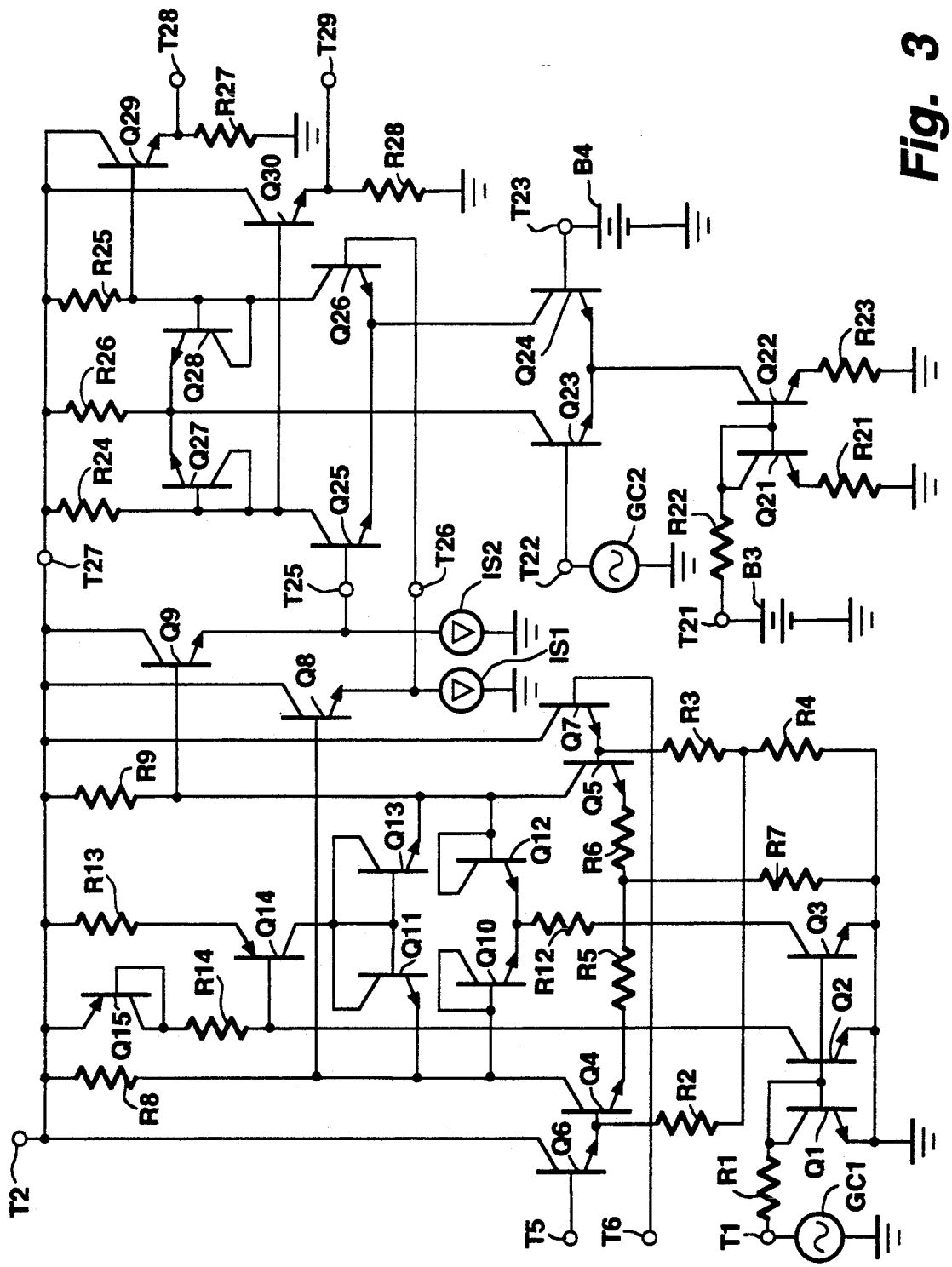
FIG. 3 is a schematic diagram of a cascade connection of the gain-controlled amplifier stages of FIGS. 1 and 2, which is also disclosed by the inventor and another in U.S. patent application Ser. No. 07/940,220 filed Sep. 8, 1992.

FIG. 3 shows a cascade connection of the FIG. 1 and FIG. 2 gain-controlled amplifiers. In operation, typically in television IF amplifier service, the two gain control signals at inputs T1 and at T22, respectively, are arranged to cooperate such that, when gain reduction starts to be applied, the gain of the second amplifier is first reduced without reducing the gain of the first amplifier. When the gain of the second amplifier has been reduced by a predetermined amount, subsequent amounts of gain reduction reduce the gain of both first and second amplifiers in a predetermined relationship. Thus, for small amounts of gain reduction, the first amplifier stage continues to operate at its full gain while overall gain reduction is achieved by reducing the gain of the second amplifier. As is known, such a mode of operation, known as delayed gain control, is beneficial to the overall noise performance because the contribution of the second amplifier is thereby kept small for smaller signals where amplifier noise may still be significant. In practice, such a delay is readily achievable by various means not shown here such as, for example, by the introduction of a voltage delay for the signal to the first amplifier.

The FIG. 1 and FIG. 2 amplifiers are suited for operation from a single positive operating supply, and FIG. 3 accordingly shows the supply terminal T27 connecting from the supply terminal T2. In practice the batteries B3 and B4 are replaced by networks within the same IC as the first and second gain-controlled amplifiers, which networks are of known type for deriving bias potentials from an operating supply potential as supplied via the supply terminal T2.

Figure 4:
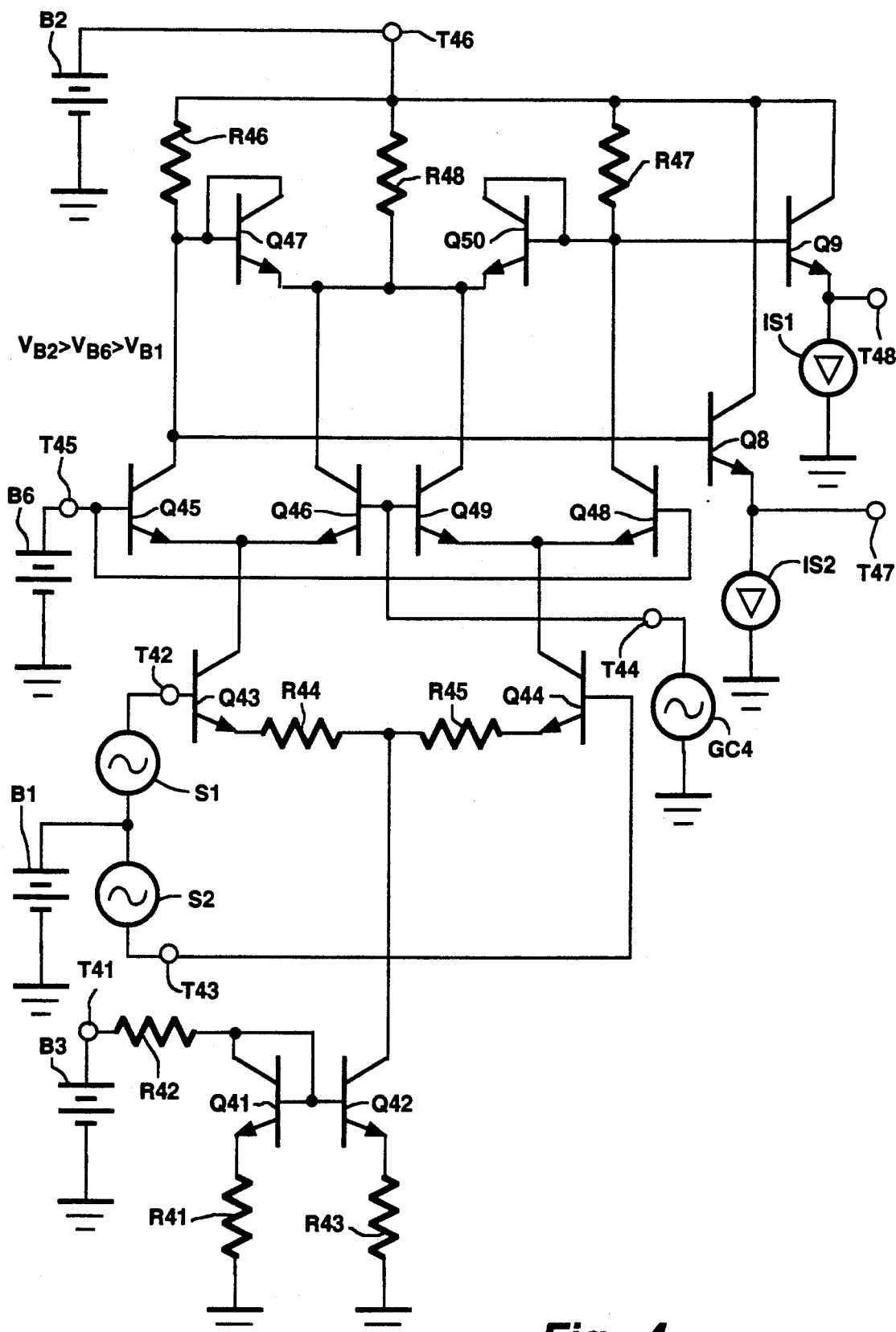
FIG. 4 is a schematic diagram of another gain-controlled amplifier stage that is particularly well-suited for use as the input stage of a plural-stage IF amplifier and is also disclosed by the inventor and another in U.S. patent application Ser. No. 07/940,220 filed Sep. 8, 1992.

FIG. 4 shows another gain-controlled amplifier that is well suited for use as the first stage in a television IF amplifier. The FIG. 4 amplifier includes a transistor Q41 of NPN conductivity type, which has its base and collector electrodes conductively joined so as to operate in a diode-connected mode. The emitter electrode of Q41 is connected via a series resistance R41 to a source of reference potential, shown as ground in FIG. 4. A reference current is supplied to the joined base and collector electrodes via a resistance R42 having one end thereof connected to them and having another end thereof connected to receive a positive operating potential $V_{B3}$ applied to a terminal T41. FIG. 4 shows the battery B3 supplying this potential.

An NPN transistor Q42 has its emitter electrode connected to ground via a series resistance R43 and its base connected to the base electrode of transistor Q41, so as to form a current mirror arrangement with respect to the reference current supplied by R42. NPN transistors Q43 and Q44 form a differential amplifier pair, having their respective emitter electrodes connected to the collector electrode of transistor Q42 via respective series resistances R44 and R45 and their base electrodes connected to respective input terminals T42 and T43 for receiving an input signal therebetween at an appropriate direct bias level. FIG. 4 shows signal sources S1 and S2 applying a balanced input signal to the input terminals T42 and T43, as referred to a positive direct bias potential $V_{B1}$ provided from the battery B1.

The NPN transistors Q45 and Q46 are connected as a current splitter for the collector current of transistor Q43, with each of them having its emitter electrode connected to the collector electrode of transistor Q43. The NPN transistors Q48 and Q49 are connected as a current splitter for the collector current of transistor Q44, with each of them having its emitter electrode connected to the collector electrode of transistor Q44. The base electrodes of transistors Q45 and Q48 are connected to receive a positive direct bias potential $V_{B6}$ applied to a terminal T45. FIG. 4 represents the source of $V_{B6}$ by a battery B6. The base electrodes of transistors Q46 and Q49 are connected to a terminal T44 for receiving a gain control voltage thereat, which FIG. 4 shows as being supplied from a source of control voltage GC4. The collector electrodes of transistors Q45 and Q48 are connected via a series resistance R46 and via a series resistance R47, respectively, to a supply terminal T46 to which a positive operating potential $V_{B2}$ is applied from the battery B2.

An electrically controllable conductance is provided between the ends of the resistances R46 and R47 remote from terminal T46. The joined collector and base electrodes of an NPN transistor Q47 and the collector electrode of transistor Q45 connect to the end of the resistance R46 remote from terminal T46. The joined collector and base electrodes of an NPN transistor Q50 and the collector electrode of transistor Q48 connect to the end of the resistance R47 remote from the supply terminal T46. The joined collector electrode and base electrodes of an NPN transistor Q47 connect to the collector electrode of transistor Q45. The emitter electrodes of transistors Q47 and Q50 and the collector electrodes of transistors Q46 and Q49 are all conductively joined and are connected to the supply terminal T46 via a series resistance R48.

The gain-controlled response appearing at the end of the resistance R46 remote from terminal T46 is applied to an output terminal T47 by the voltage-follower action of the NPN common-collector-amplifier transistor Q8. The gain-controlled response appearing at the end of the resistance R47 remote from terminal T46 is applied to an output terminal T48 by the voltage-follower action of the NPN common-collector-amplifier transistor Q9.

In operation, the collector output current of differential-amplifier transistor Q43 constitutes the tail current of differential pair transistors Q45 and Q46, which function as a current splitter. Depending on the control signal level at terminal T44, the collector output current of differential pair amplifier transistor Q43 can be steered through transistor Q45 or through transistor Q46 and thence through diode-connected transistor Q47, or partly through each of transistors Q45 and Q46. In symmetrical fashion, the collector output current of differential pair amplifier transistor Q44 can be steered through transistor Q48 or through transistor Q49 and thence through diode-connected transistor Q50, or partly through each of transistors Q48 and Q49.

The steering of currents to flow entirely through the transistors Q46 and Q49 applies the entire collector currents of transistors Q43 and Q44 including their differential variations to the node between the diode-connected transistors Q47 and Q50, where the differential signal variations cancel each other out at a "virtual ground" for AC. There are no components of Q45 and Q48 collector currents flowing through transistors Q46 and Q49, the differential variations of which can respectively flow to the load resistances R46 and R47 to cause corresponding signal voltages across them. The common-mode DC components of the collector currents of transistors Q43 and Q44 are in combined flow through the diode-connected transistors Q47 and Q50, causing their conductances to become relatively small respective to the load resistances R46 and R47, respectively. The low shunt resistances of the diode-connected transistors Q47 and Q50 determine the voltage gain of the FIG. 4 amplifier as they ratio against resistances R46 and R47, respectively. When the combined collector currents of transistors Q43 and Q44 are steered through diode-connected transistors Q47 and Q50, the gain will be at its minimum level.

The steering of currents to flow entirely through the transistors Q45 and Q48 applies the entire collector currents of the transistors Q43 and Q44 including their differential variations to the load resistances R46 and R47, respectively. The concomitant steering of currents away from the transistors Q46 and Q49 results in no current being steered through the diode-connected transistors Q47 and Q50, so their conductances are accordingly very low and do not shunt the load resistances R46 and R47 appreciably. The voltage gain of the FIG. 4 gain-controlled amplifier is therefore is at its maximum level.

The steering of the collector currents of the emitter-coupled differential amplifier transistors Q43 and Q44 partially through transistors Q45 and Q48 reduces gain by applying only a fraction of the differential variations of the collector currents to the load resistances R46 and R47, thereby reducing the corresponding signal voltages across them in a degree controlled by the gain control potential GC4. The steering of the collector currents of the emitter-coupled differential amplifier transistors Q43 and Q44 partially through transistors Q46 and Q49 at the same time further reduces gain by causing the common-mode components of the collector currents to flow through the diode-connected transistors Q47 and Q50, so their conductances shunt the load resistances R46 and R47 in a degree also controlled by the gain control potential GC4.

In any case, the total current in resistance R46 remains unchanged during the gain control process, being always equal to the collector output current of transistor Q43 and likewise, the total current in resistance R47 remains unchanged during the gain control process, being always equal to the collector output current of transistor Q44. Thus, if the transistors are well matched, there will be no disturbance of the DC conditions of operation of the amplifier as the gain is changed.

Similar advantages result with the FIG. 4 gain-controlled amplifier as were described in reference to the FIG. 1 gain-controlled amplifier. The FIG. 4 gain-controlled amplifier is fitted for use as the first stage of a PIX IF amplifier, with the differential amplifier transistors Q43 and Q44 being emitter-coupled with substantial differential-mode resistance between their emitter electrodes in order to avoid overload distortion at expected IF amplifier input signal levels. The linear differential-mode resistance provided by the resistors R44 and R45 permits the differential IF input signal potential between their base electrodes to reach as high as about 100 millivolts RMS without either transistor being cut off on signal peaks. The various emitter-coupling networks described above with regard to the differential-amplifier transistors Q4 and Q5 can be used with differential-amplifier transistors Q43 and Q44 as well.

Figure 5:
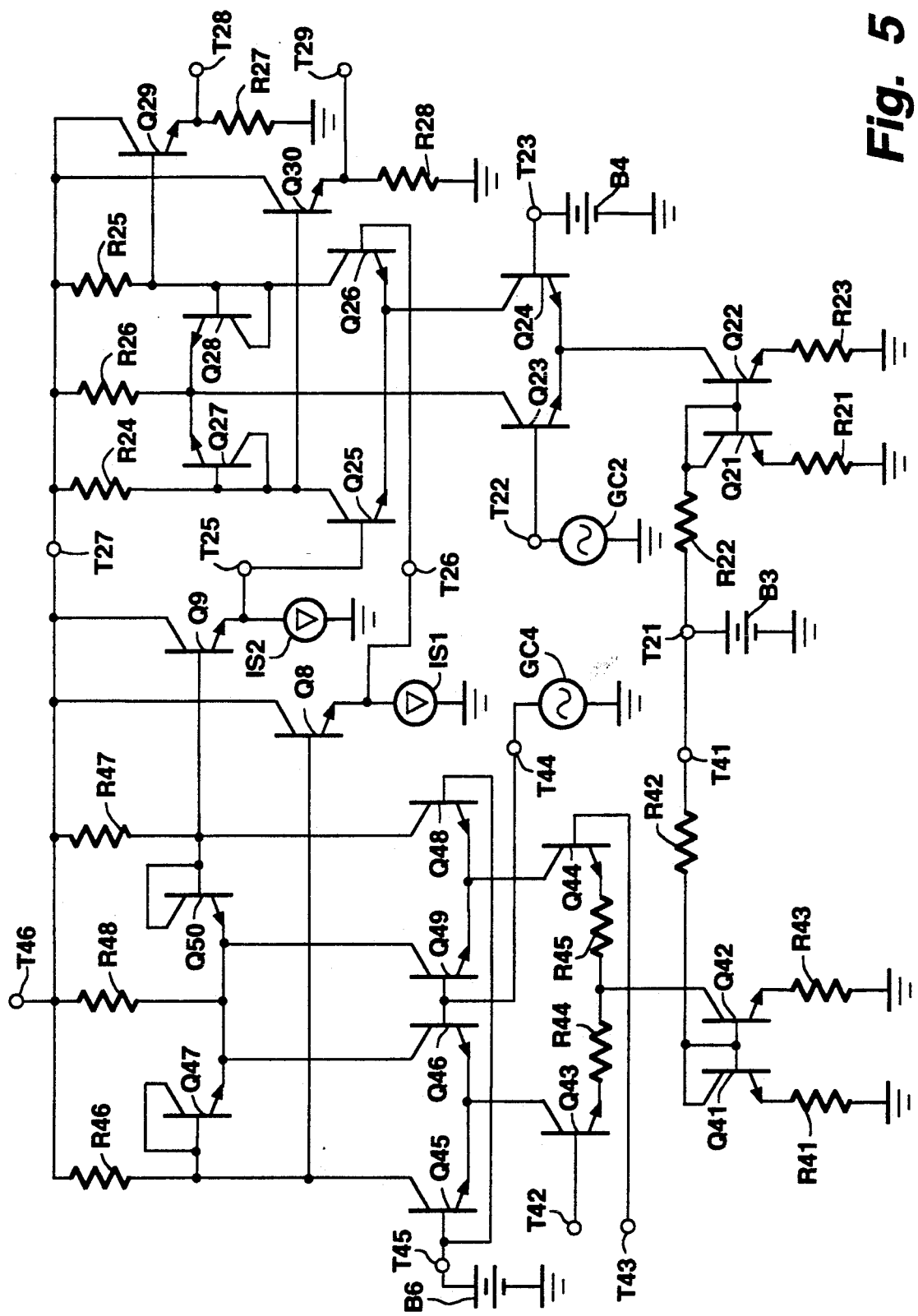
FIG. 5 is a schematic diagram of a cascade connection of the gain-controlled amplifier stages of FIGS. 4 and 2, which is also disclosed by the inventor and another in U.S. patent application Ser. No. 07/940,220 filed Sep. 8, 1992.

FIG. 5 shows a cascade connection of the FIG. 4 and FIG. 2 gain-controlled amplifiers. NPN transistors Q8 and Q9 with their respective resistors R49 and R50 form emitter-follower buffer stages for the output of the first amplifier. The input signal is applied at terminals T2 and T3 and the two gain control signals are applied at terminals T44 and T22, respectively. Similar considerations to the FIG. 3 cascade connection of gain-controlled amplifiers are applicable regarding delayed gain control or delayed automatic gain control.

The FIG. 4 and FIG. 2 amplifiers are suited for operation from a single positive operating supply, and FIG. 5 accordingly shows the supply terminal T27 connecting from the supply terminal T46. In a variant of FIG. 5 the transistor Q42 receives its base potential from the joined collector and base electrodes of Q21 and elements R41, R42 and Q41 are dispensed with.

Figure 6:
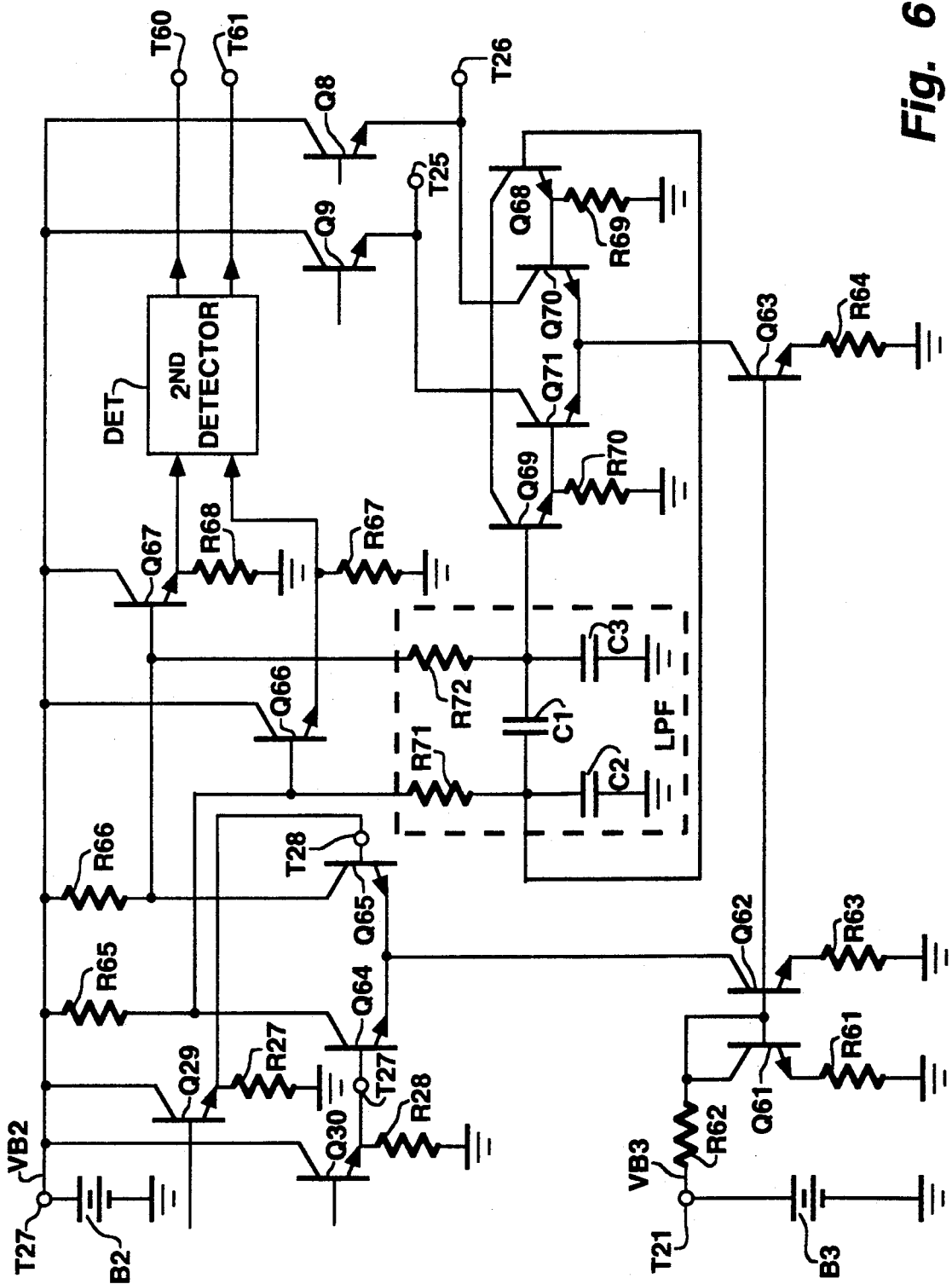
FIG. 6 is a schematic diagram of a third amplifier stage for further cascade connection after the FIGS. 3 or 5 cascade connection of gain-controlled amplifier stages, thereby completing a three-stage IF amplifier; a second detector for accepting balanced amplified IF signals superposed on respective direct bias potentials that ideally are equal to each other; and an on-chip filter for developing a balanced error current signal differentially responsive to those respective direct bias potentials, which balanced error current signal is fed back to the balanced input of the second gain-controlled amplifier stage per FIG. 2 in the FIGS. 3 or 5 cascade connection of gain-controlled amplifier stages.

FIG. 6 shows circuitry that is included in an IC together with a cascade connection of amplifier stages, either as shown in FIG. 3, or as shown in FIG. 5. This circuitry includes a third fixed-gain voltage amplifier to provide the additional voltage gain needed to drive a second detector DET, which second detector DET may be a video detector or may be a downconverter for generating sound intermediate frequencies. Commonly, second detectors are designed to be driven with balanced signals from the IF amplifier chain. Then, the desideratum is that the direct bias potentials on which these balanced signals supplied to the second detector from the IF amplifier chain be reasonably well matched, at least to within 20 millivolts or so. In previous designs the direct bias potentials on which these balanced signals supplied to a second detector are extracted by respective low-pass filters, each filter using an off-chip capacitor. The responses of these low-pass filters are then differentially combined to develop an error signal fed back to the input of the IF amplifier chain, thereby to complete a direct-coupled (d-c) feedback loop for degenerating the error signal. This approach has been found to be disadvantageous. Bringing the fully amplified IF signals off-chip, even to bypass capacitors increases the risk of undesirable regeneration in the IF amplifier chain. The high voltage gain of the full IF chain under weak-signal conditions and the changes in phase margin that may occur in different portions of the AGC range cause problems of dc feedback loop stabilization. The reliability of interfaces between the IC and its external environment tends to be lower than the reliability of the electronic circuitry interfaced between. The number of pins required on the IC package affects its cost, and two pins are needed for the off-chip capacitors used in the low-pass filters. The off-chip capacitors have to be separately inventoried from the IC during television receiver production.

FIG. 6 shows lowpass filtering that is on-chip and does not use off-chip IF bypass capacitors, which lowpass filtering applies the direct bias potentials on which the balanced signals supplied to the second detector are respectively superposed to the bases of a pair of transistors connected in emitter-coupled differential-amplifier configuration to generate balanced collector current responses to the difference between these direct bias potentials. These balanced collector current responses are fed back to the emitters of the transistors in the common-collector amplifiers used to couple the first gain-controlled emitter-coupled differential amplifier in the IF amplifier chain to the second gain-controlled emitter-coupled differential amplifier in the IF amplifier chain. This completes a direct-coupled feedback loop for degenerating the differences between the direct bias potentials on which the balanced signals supplied to the second detector are respectively superposed. The FIG. 6 circuitry is more specifically described, following.

A transistor Q61 is of NPN conductivity type and has its base and collector electrodes conductively joined so as to operate in a diode-connected mode. The emitter electrode of Q61 is connected via a series resistance R61 to a source of a reference potential, here shown as ground. A reference current is supplied to the joined base and collector electrodes via a resistance R62 having one end thereof connected thereto and another end thereof connected to receive a positive direct bias potential $V_{B3}$ applied to the terminal T21. FIG. 6 shows $V_{B3}$ as being supplied from a battery B3. NPN transistors Q62 and Q63 have their emitter electrodes connected to ground via resistances R63 and R64, respectively, and have their base electrodes connected to the base electrode of transistor Q61, so as to form a dual-output current mirror arrangement with respect to the reference current supplied via R62.

NPN transistors Q64 and Q65 form a differential amplifier pair, having their respective emitter electrodes connected to the collector electrode of transistor Q62. The gain-controlled, amplified, balanced IF signals at the emitter electrodes of the emitter-follower transistors Q29 and Q30 are applied to the base electrodes of transistors Q64 and Q65. The collector electrodes of transistors Q64 and Q65 are connected via respective resistances R65 and R66 to a supply terminal T27 for receiving a positive operating potential $V_{B2}$, shown as being supplied from the battery B2. NPN transistors Q66 and Q67 are arranged as voltage followers of the emitter-follower type, which serve as output buffer stages. The base electrodes of Q66 and Q67 connect to the collector electrodes of Q64 and Q65, respectively, and the collector electrodes of Q66 and Q67 connect to supply terminal T27. The emitter electrodes of transistors Q66 and Q67 connect to ends of respective load resistances R67 and R68 the other ends of which connect to ground.

The emitter electrodes of transistors Q66 and Q67 supply balanced IF output signals superposed on direct bias potentials to the second detector DET. The second detector DET supplies an output signal to the terminal T60 and may, as shown in FIG. 6, supply another output signal to the terminal T61, which output signals are balanced in nature. The second detector DET is the video detector in the case of a PIX IF amplifier. The second detector DET can be an intercarrier sound detector in the case where, in addition to a PIX IF amplifier, another video IF amplifier is used just for supplying the intercarrier sound detector with gain-controlled, amplified IF signals generated by downconverting the RF picture and sound carriers.

The direct bias potentials on which the balanced IF output signals are superposed are automatically adjusted by a differential-mode direct-coupled DC feedback loop. The balanced IF output signals at the collector electrodes of transistors Q64 and Q65 are supplied to a four-terminal lowpass filter LPF, which supplies a balanced response to the base electrodes of common-collector-amplifier NPN transistors Q68 and Q69. The transistors Q68 and Q69 have respective emitter load resistors R69 and R70 connecting from their emitter electrodes to a point at ground potential.

The balanced response applied to the base electrodes of transistors Q68 and Q69 essentially consists of the direct bias potentials on which the balanced IF output signals are superposed; and transistors Q68 and Q69 function as voltage followers of the emitter-follower type for applying the difference between these direct potentials between the base electrodes of NPN transistors Q70 and Q71. The transistors Q70 and Q71 are connected in emitter-coupled differential amplifier configuration. The interconnection of their emitter electrodes has the collector electrode of the NPN transistor Q63 connected thereto, and transistor Q63 withdraws a collector current from this tail connection that is proportional to the reference current flowing through the resistance R62, owing to the current mirror action of transistors Q61 and Q63. The collector electrodes of the transistors Q70 and Q71 are connected to withdraw balanced currents from the emitter electrodes of the previously described emitter-follower transistors Q9 and Q8, respectively, in response to the difference between the direct potentials on which the balanced IF output signals supplied to the second detector DET are superposed. These connections close the direct-coupled, differential-mode DC feedback loop used for eliminating any substantial difference between these direct bias potentials.

The lowpass filter LPF includes a resistance R71 for connecting the collector electrode of transistor Q64 to the base electrode of transistor Q68, a resistance R72 for connecting the collector electrode of transistor Q65 to the base electrode of transistor Q69, and a floating capacitance C1 connected between the base electrodes of transistors Q68 and Q69. The lowpass filter LPF further includes two similar capacitances C2 and C3 shunting the base electrodes of transistors Q68 and Q69, respectively, to a point or points of ground potential. The capacitances C2 and C3 are relatively small compared to the floating capacitance C1 and supress common-mode signal at the base electrodes of transistors Q68 and Q69.

The capacitances C1, C2 and C3 are typically of metal-oxide-semiconductor (MOS) construction. The floating capacitance C1 provides the equivalent filtering action of two shunt-to-ground capacitances, each twice its capacitance size. An MOS floating capacitance C1 takes up only a quarter as much IC die area as two shunt-to-ground capacitances providing equivalent filtering action. The floating capacitance C1 may be constructed from two MOS capacitors of the same size, parallelly connected with the metal plate of each connecting to the polysilicon plate of the other. The equal capacitances of the polysilicon plates to substrate ground appear in respective ones of the capacitances C2 and C3, then, as at least portions of those capacitances.

Since the feedback loop used for eliminating any substantial difference between the direct bias potentials on which balanced IF signals are superposed is around only two voltage-gain stages with a maximum voltage gain of a hundred-fold to two-hundred-fold, rather than around three voltage-gain stages with a maximum voltage gain of a thousand-fold or more, the primary open-loop pole provided by the lowpass filter LPF need not be located as low in frequency in order to assure closed-loop stability. This reduces the required size of the floating capacitance C1. The faster time constant in the feedback loop makes it less prone to "setting up" during impulse noise or start-up conditions. The use of differential-mode current feedback to the emitter electrodes of emitter-follower transistors Q9 and Q8 provides a non-linear feedback response with reduced gain for large errors. This also tends to prevent erratic behavior by the feedback loop during start-up or impulse noise conditions.

Figure 7:
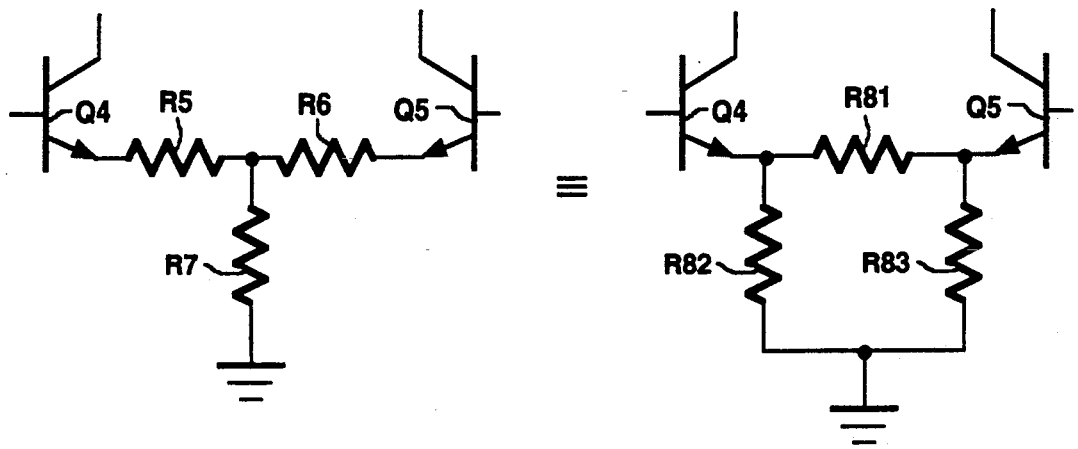
FIG. 7 is a schematic diagram of a modification that can be made to the FIG. 1 gain-controlled amplifier stage, which is also disclosed by the inventor and another in U.S. patent application Ser. No. 07/940,220 filed Sep. 8, 1992.

FIG. 7 shows a modification that can be made to the FIG. 1 gain-controlled amplifier, in which modification the tee connection of resistors R5, R6 and R7 is replaced by an equivalent pi connection of resistors R81, R82 and R83. The resistance of R61 equals the sum of the resistances of R5 and R6; the resistance of R82 equals the sum of the resistances of R5 and R7; the resistance of R83 equals the sum of the resistances of R6 and R7.

Figure 8:
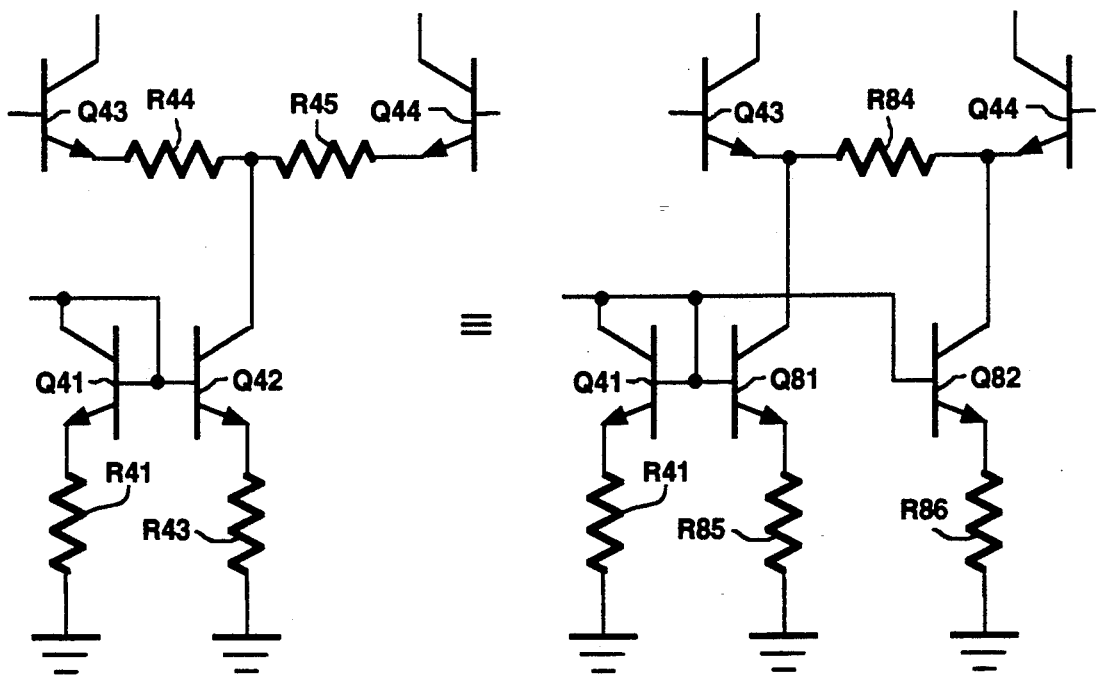
FIG. 8 is a schematic diagram of a modification that can be made to the FIG. 4 gain-controlled amplifier stage, which is also disclosed by the inventor and another U.S. patent application Ser. No. 07/940,220 filed Sep. 8, 1992.

FIG. 8 shows a modification that can be made to the FIG. 1 gain-controlled amplifier, in which modification the tee connection of resistors R44, R45 and the constant current source formed by transistor Q42 and resistor R43 is replaced by an equivalent pi connection of resistor R84 and two constant current sources, one formed by transistor Q81 and resistor R85, and the other formed by transistor Q82 and resistor R86. That is, the single-output current mirror comprising elements Q41, R41, Q42 and R43 is replaced by a dual-output current mirror comprising elements Q41, R41, Q81, R85, Q82 and R86.

Figure 9:
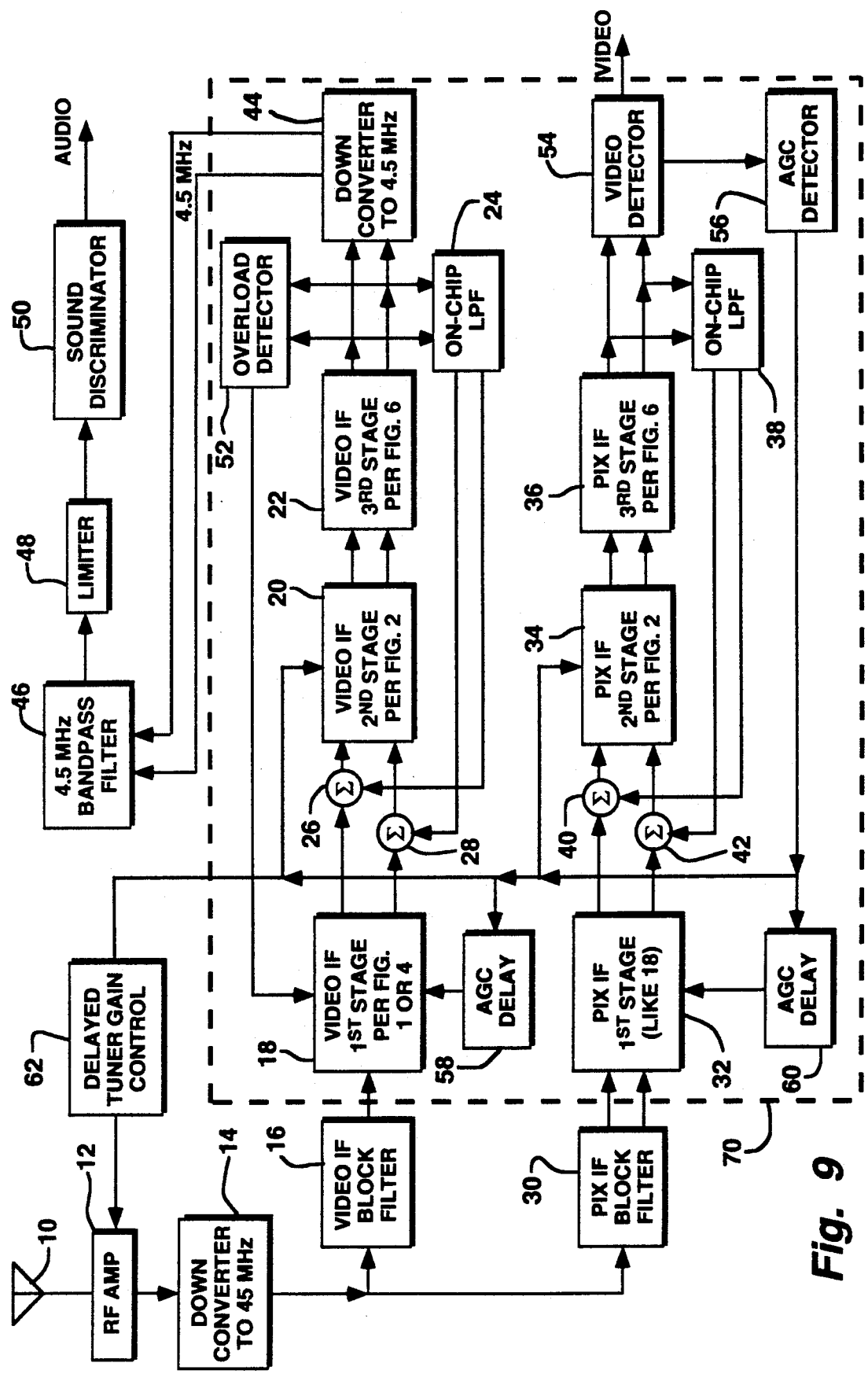
FIG. 9 is a block schematic diagram of those portions of a television receiver or video tape recorder used for recovering audio-signal, video-signal and synchronizing-signal portions of a transmitted television signal, which television receiver in accordance with the invention uses parallel IF amplifier chains, each of which chains includes intermediate-frequency amplifiers of the type shown in FIGS. 3 and 6 or in FIGS. 5 and 6.

FIG. 9 shows those portions of a television receiver or video tape recorder used for recovering audio-signal, video-signal and synchronizing-signal portions of a transmitted television signal, which television receiver uses intermediate-frequency amplifiers of the type shown in FIG. 3 or in FIG. 5. FIG. 9 is useful in understanding how delayed automatic gain control can be applied to intermediate-frequency amplifiers of the type shown in FIG. 3 or in FIG. 5.

Television signals captured by an antenna 10 are supplied to a radio-frequency amplifier 12. A downconverter 14, which typically includes a mixer and one or more tunable oscillators oscillating at frequencies above those in the television signal bands, responds to the amplified television signals supplied from the radio-frequency amplifier 12 to generate IF signals with sound carrier at 41.25 MHz and picture carrier at 45.75 MHz. The downconverter 14 is sometimes referred to as the "first detector".

The IF signals from this first detector are supplied to a block filter 16 that separates the sound carrier and its FM sidebands (and the picture carrier as well in intercarrier sound receivers) for application to a cascade connection of a first video IF stage 18, a second video IF stage 20, and a third video IF stage 22. An on-chip lowpass filter 24 responds to differences in the direct bias potentials on which the balanced IF output signals of the third video IF stage 22 are superposed, to supply differential-mode feedback signals to summing elements 26 and 28. The summing elements 26 and 28 combine the differential-mode feedback signals with the balanced output signals from the first video IF stage 18 to generate corrected input signals for the second video IF stage 20.

The IF signals from the first detector are also supplied to a block filter 30 that separates the vestigial picture carrier and its AM sideband for application to a cascade connection of a first PIX IF stage 32, a second PIX IF stage 34, and a third PIX IF stage 36. An on-chip lowpass filter 38 responds to differences in the direct bias potentials on which the balanced IF output signals of the third PIX IF stage 36 are superposed to supply differential-mode feedback signals to summing elements 40 and 42. The summing elements 40 and 42 combine the differential-mode feedback signals with the balanced output signals from the first PIX IF stage 32 to generate corrected input signals for the second PIX IF stage 34.

A second converter 44, which can be an exalted carrier synchronous detector in a television receiver generating sound-IF signal by the intercarrier method, receives amplified 45 MHz IF signals from the third video IF stage 22 and responds to generate a frequency-modulated 4.5 MHz-IF signal selected by a bandpass filter 46 with a passband centered at 4.5 MHz. The bandpass filter 46 suppresses the image frequencies that would otherwise accompany the frequency-modulated 4.5 MHz sound-IF signal, as applied to a limiter 48. The limiter 48 suppresses unwanted amplitude modulation of the frequency-modulated 4.5 MHz carrier it supplies as sound-IF response to an FM sound discriminator 50, which discriminator detects the frequency-modulation of the 4.5 MHz carrier to generate the audio signal to be supplied to the remainder of the television receiver or video tape recorder. There are other known means for detecting sound-descriptive information contained in the frequency modulation of the sound-IF response, which means include means for suppressing response of said means for detecting sound-descriptive information to variations in the amplitude of the sound-IF response, such as the well-known ratio detector.

A video IF overload detector 52 responds to the amplified IF signals from the third video IF stage 22 exceeding a level acceptable as input signal to the down converter 44, to provide an auxiliary automatic-gain-control (AGC) signal to the first video IF stage 18, augmenting during abnormal conditions a normal automatic-gain-control (AGC) signal generated responsive to PIX IF signal. Under normal conditions, however, both the video IF and the PIX IF chains are gain controlled responsive soley to the normal automatic-gain-control (AGC) signal generated responsive to PIX IF signal. To facilitate the AGC tracking between the video IF and the PIX IF chains, the video IF amplifiers 18, 20 and 22 are constructed within the confines of the same IC as the PIX IF amplifiers 32, 34 and 36. The downconverter 44, the video IF overload detector 52, a video detector 54, an AGC detector 56 and AGC delay circuits 58 and 60 are advantageously included within the same IC as well.

The video detector 54, which receives amplified IF signals from the third PIX IF stage 36, detects a composite video signal. The automatic-gain-control (AGC) detector 56 develops an automatic-gain-control (AGC) signal by detecting peaks of the synchronizing pulses included in the composite video signal. If the video detector 54 is an envelope detector, the AGC detector 56 is normally a keyed AGC detector in order to provide the AGC immunity to impulse noise. If the video detector 54 is a synchronous detector, which is the modern trend in TV receiver design, the AGC detector 56 preferably includes filtering of its input signal to suppress response to the 2 MHz or so component of the composite video signal detected by the video detector 54, which component arises from the ringing of the block filter 30 at its midband natural frequency. This filtering of the input signal of the AGC detector 56 should pass frequencies up to about 500 kHz; this is so that equalizing pulses can be peak detected and the very top of the video image is not undesirably increased in brightness respective to the remainder of the video image. The AGC detector 56 in any case includes filtering of its output signal to a noise bandwidth of 400 Hz or so.

The AGC signal developed by the AGC detector 56 proceeding from the composite video signal detected by the video detector 38 is used to control gain in both the PIX IF and the video IF amplifiers as well as gain in the RF amplifier 12. Developing AGC proceeding from the composite video signal permits precise gain control of the PIX IF amplifiers, which have to amplify AM sidebands linearly. The video IF amplifiers need gain control primarily to avoid overloading the down-converter 44, gross overloading of which is forestalled in any case by the video IF overload detector 52. The linearity with which the FM sidebands of the sound carrier are amplified is not of particular concern. The bandpass filter 46 and the limiter 48 suppress the effects of any gain errors in the video IF amplifier chain and the down-converter 44 as well. So obtaining acceptable AGC tracking of the video IF amplifiers 18 and 20 to the PIX IF amplifiers 32 and 34 is practical to obtain. The AGC signal developed by the AGC detector 56 is applied in parallel, without delay, to the second stages 20 and 34 of the video IF and PIX IF amplifiers. The AGC signal developed by the AGC detector 56 is applied in parallel, with delay, to the first stages 18 and 32 of the video IF and PIX IF amplifiers. Preferably, as shown in FIG. 9, the first stages 18 and 32 of the video IF and PIX IF amplifiers have delayed AGC applied to them via respective AGC delay circuits 58 and 60, so that only a single AGC line has to be run from the portion of the IC having the PIX IF located therein and the portion of the IC having the video IF located therein.

The AGC signal developed by the AGC detector 56 is applied to the RF amplifier 12 with still further delay, as provided by tuner gain control delay circuitry 60, usually located on the IF amplifier integrated-circuit chip. Under weak-signal-reception conditions, any reduction of the gain through the RF and IF amplifier chains takes place in the second stages 20 and 34 of the sound and PIX IF amplifiers. The RF amplifier 12 and the first stages 18 and 32 of the sound and PIX IF amplifiers operate at full gain to secure best signal-to-noise ratios in the signals supplied to the second stages 20 and 34 of the sound and PIX IF amplifiers. As second stages 20 and 34 of the sound and PIX IF amplifiers reach favorable signal levels with increase in the RF signal level from the antenna 10, the AGC delay circuits 58 and 60 apply delayed AGC to the first stages 18 and 32 of the sound and PIX IF amplifiers to reduce their gain. Under strong-signal-reception conditions, the tuner gain control delay circuitry 62 applies AGC signal to the RF amplifier 12 to reduce its gain, thereby to avoid overloading the downconverter 14 and the first stages 18 and 32 of the sound and PIX IF amplifiers.

A dashed line 70 surrounds elements that, except for large-capacitance shunt bypass capacitors, are normally constructed within a single monolithic integrated circuit (IC). The PIX IF chain is operated with balanced signals throughout, from the input signal applied to the first IF amplifier stage 32 from the PIX IF block filter 30 to the output from the third PIX IF amplifier stage 36 to the video detector 54, and the output signal from the video detector 38 is taken single-ended from the IC, to suppress any self-oscillatory tendencies in the higher-gain portions of the PIX IF gain control range. The video IF chain is operated with single-ended input signal applied to the first IF amplifier stage 18 from the video IF block filter 16, allowing some simplification of that block filter 16, but the rest of the video IF chain is operated with balanced signals, to suppress any self-oscillatory tendencies in the higher-gain portions of the video IF gain control range. The output signal from the downconverter 44 is supplied in balanced form to the bandpass filter 46, to suppress any self-oscillatory tendencies in the higher-gain portions of the video IF gain control range.

Figure 10:
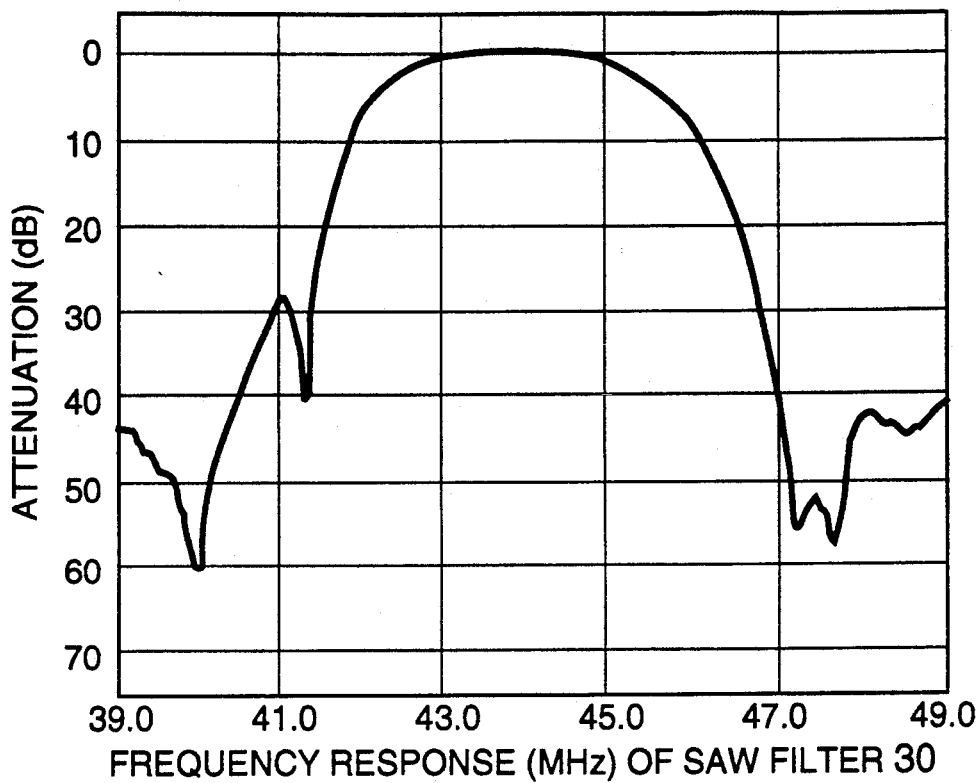
FIG. 10 is a plot of the response of the SAW filter preceding the IF amplifier chain in the FIG. 9 apparatus which IF amplifier chain supplies video intermediate frequencies to the video detector.

FIG. 10 shows a suitable block filter 30 response, presuming a 45.75 MHz video i-f carrier frequency to be used, which response includes a relatively deep (>40 dB) trap at the adjacent-channel sound-carrier frequency of 47.25 MHz. This deep trap causes the response to the 45.75 MHz video i-f carrier frequency to be located on a downward slope in frequency response, about 6 dB down. The response to the in-channel sound-carrier frequency of 41.25 MHz is reduced by about 30 dB. The block filter 30 exhibits linear-phase response throughout its passband. An example of a SAW filter exhibiting this type of response is the SAF45 MVB80Z manufactured by Murata Manufacturing Co., Ltd., in Erie, Pa.

Figure 11:
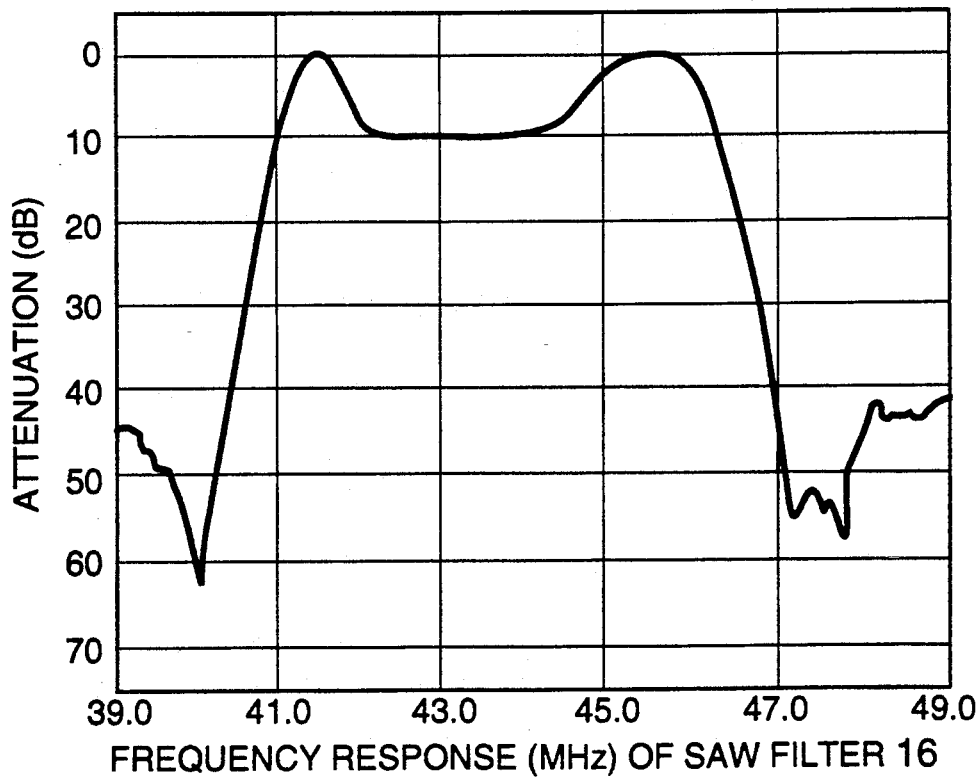
FIG. 11 is a plot of the response of the SAW filter preceding the IF amplifier chain in the FIG. 9 apparatus which IF amplifier chain supplies video intermediate frequencies to the down converter for generating 4.5 MHz sound intermediate frequencies.

FIG. 11 shows a suitable block filter 16 response for a TV receiver using intercarrier sound, presuming a 45.75 MHz video i-f carrier frequency to be used, which response is double-humped in nature. A first of the humps has a peak at 41.25 MHz, the IF frequency to which the sound carrier is translated during the first detection procedure; and a second of the humps has a peak at 45.75 MHz, the IF frequency to which the picture carrier is translated during the first detection procedure. The block filter 16 response also includes a relatively deep (>40 dB) trap at the adjacent-channel sound-carrier frequency of 47.25 MHz. The picture carrier is not on a downward slope into the trap, however, which helps the AFT in distinguishing the picture carrier from in-channel and adjacent-channel sound carriers. A saddle between the humps at 41.25 and 45.75 MHz reduces the $\approx$2.25 MHz video that is detected by the down converter 44, second harmonic distortion of which video can pass through the 4.5 MHz bandpass filter 46 undesirably to affect the limiting of sound IF by the limiter 48.

Figure 12:
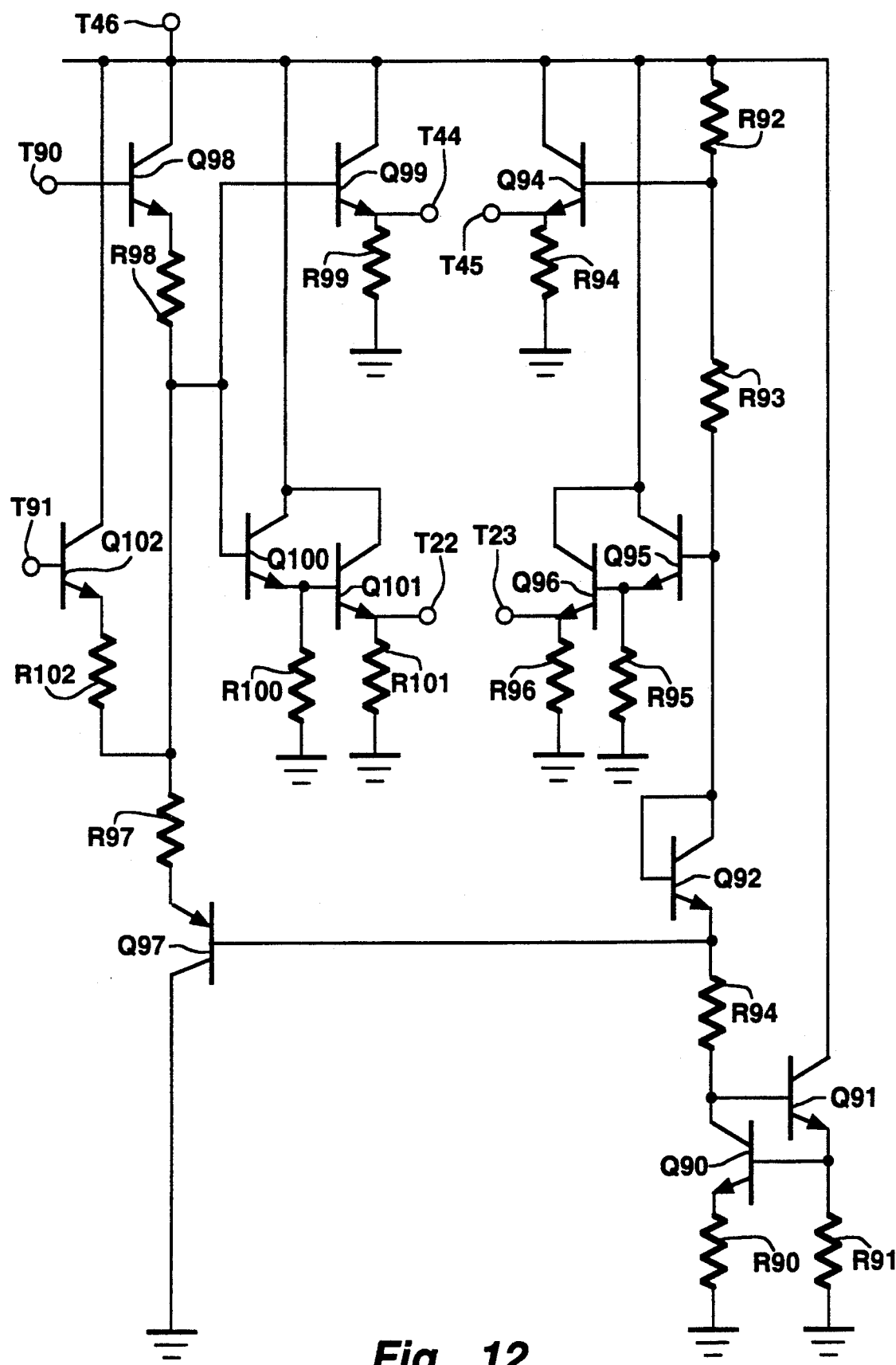
FIG. 12 is a a schematic diagram of AGC delay circuitry suitable for use with the FIG. 5 cascade connection of the gain-controlled amplifier stages.

FIG. 12 is a schematic diagram of AGC delay circuitry suitable for use with the FIG. 5 cascade connection of the gain-controlled amplifier stages. An NPN transistor Q90 has an emitter degeneration resistance R90 and is provided direct-coupled collector-to-base feedback by an emitter-follower comprising an NPN transistor Q91 having an emitter load resistance R91 connected between its emitter and a point of reference potential, shown as ground. The degenerative collector-to-base feedback adjusts the conduction of Q90, so as to maintain a voltage between its emitter and collector that is the sum of the forward drops across the base-emitter junctions of Q90 and Q91. The collector current of Q90 flows through the series connection of resistances R92 and R93 and a diode-connected NPN transistor Q92 to develop respective voltage drops across these elements.

The offset from positive operating potential at the terminal T46 developed by the voltage drop across the resistance R92 is applied to the base of an NPN emitter-follower transistor Q94, the emitter of which provides a direct bias potential to the terminal T45 and is returned via an emitter load resistance R94 to a point of reference potential shown as being ground. The offset from positive operating potential at the terminal T46 developed by the combined voltage drops across the resistances R92 and R93 is applied to the base of an NPN emitter-follower transistor Q95, the emitter of which provides a direct bias potential to the base of another NPN emitter-follower transistor Q96 and is returned via an emitter load resistance R95 to a point of reference potential shown as being ground. The emitter of Q96 provides a direct bias potential to the terminal T23 and is returned via an emitter load resistance R96 to a point of reference potential shown as being ground. The combined voltage drops across resistances R92 and R93 and the diode-connected transistor Q92 bias the base of a PNP emitter-follower transistor Q97. The emitter of Q97 provides a direct bias potential against which the AGC of the IF amplifier stages is referred, which direct bias potential is similar to the direct bias potential applied to the base of Q95.

A resistive potential divider comprises resistances R97 and R98 connected between the emitters of Q97 and of an NPN emitter-follower transistor Q98, which receives AGC voltage at its base via an AGC terminal T90. The difference between the AGC voltage as offset by the emitter-to-base drop of Q98 appearing at the emitter of Q98 and the direct bias potential appearing at the emitter of Q97 is divided for application to the base electrodes of NPN emitter-follower transistors Q99 and Q100. The emitter of Q99 provides a direct bias potential to the termimal T44 and is returned via an emitter load resistance R99 to a point of reference potential shown as being ground. The emitter of Q99 provides a direct bias potential to the terminal T44 and is returned via an emitter load resistance R99 to a point of reference potential shown as being ground. The emitter of Q100 provides a direct bias potential to the base of another NPN emitter-follower transistor Q101 and is returned via an emitter load resistance R100 to a point of reference potential shown as being ground. The emitter of Q101 provides a direct bias potential to the terminal T22 and is returned via an emitter load resistance R101 to a point of reference potential shown as being ground. (To provide a more gradual reduction of the voltage gain in the second controlled-gain voltage amplifier of the IF amplifier before delayed AGC begins to reduce the voltage gain of its first controlled-gain voltage amplifier, the transistor Q23 in the second controlled-gain voltage amplifier has emitter degeneration resistance inserted between its emitter and the tail connection at the emitter of the transistor Q24.)

When the AGC potential applied to the terminal T90 is insufficiently positive to forward bias the base-emitter junction of Q98, there is no emitter current flow therefrom through the potential divider resistances R97 and R98. Accordingly, the potential drop across each of the resistances R97 and R98 is essentially zero-valued. The emitter voltage of Q97 is thus applied to the bases of Q99 and Q100 via R97. The potential at terminal T44 is consequently less positive than the potential at terminal T46, biasing the first gain-controlled voltage amplifier stage of the FIG. 5 cascade connection for full voltage gain. Since Q97 is not biased into forward conduction, its emitter voltage is somewhat more negative than the direct bias potential applied to the base of Q95. The potential at terminal T22 is consequently less positive than the potential at terminal T23, biasing the second gain-controlled voltage amplifier stage of the FIG. 5 cascade connection for full voltage gain.

As the AGC potential applied to the terminal T90 becomes positive enough to forward bias the base-emitter junction of Q98, the emitter current flow therefrom flows through the potential divider resistances R97 and R98 causing drops thereacross directly related to the amount by which the AGC potential applied to the terminal T90 forward biases the base-emitter junction of Q98. The potential at terminal T22 approaches the potential at terminal T23, biasing the second gain-controlled voltage amplifier stage of the FIG. 5 cascade connection for reduced voltage gain. Owing to the potential drop across R93, the potential at terminal T44 is still less positive than the potential at terminal T45, biasing the first gain-controlled voltage amplifier stage of the FIG. 5 cascade connection potential for full voltage gain and delaying the application of gain control thereto.

As the AGC potential applied to the terminal T90 becomes still more positive, the emitter current flow from Q98 causes the drop across R97 to approach the drop across R93. The potential at terminal T44 approaches the potential at terminal T45, biasing the first gain-controlled voltage amplifier stage of the FIG. 5 cascade connection for reduced voltage gain. As the AGC potential applied to the terminal T90 becomes still more positive, the emitter current flow from Q98 causes the drop across R97 to exceed the drop across R93. The potential at terminal T44 becomes more positive than the potential at terminal T45, biasing the first gain-controlled voltage amplifier stage of the FIG. 5 cascade connection for minimal voltage gain.

A terminal T91 can be used for receiving an overload detector voltage from the video IF overload detector 52 of FIG. 9. FIG. 12 shows the voltage being applied via an NPN emitter-follower transistor Q102 to one end of a further potential divider resistance connected R102 at its other end to the interconnection of potential divider resistances R97 and R98 causing drops across R102 and R97 directly related to the amount by which the overload detector voltage applied to the terminal T91 forward biases the base-emitter junction of Q102.

The present invention is herein disclosed and its principles explained by way of exemplary embodiments, but is not limited to such embodiments. As will be apparent to one skilled in the art, various changes and modifications can be made without departing from the spirit of the invention. By way of example, with careful layout on the IC die, the two IF amplifier chains can share some AGC application circuitry, rather than using separate AGC application circuitry as described with regard to FIGS. 9 and 12. The invention can be embodied in a television receiver not utilizing intercarrier sound, with the "video" IF amplifiers used for amplifying narrower-band IF signals essentially consisting of the sound carrier wave and its frequency-modulation sidebands. Television signal receiving apparatus using plural conversion previous to the video detector can be constructed in accordance with the principles of the invention. The controlled-gain amplifiers herein described utilize NPN amplifying transistors; clearly, PNP transistors can be substituted with appropriate circuit modifications as familiar to persons skilled in the art, or field effect transistors may be used instead of bipolar transistors, again with appropriate circuit modifications as are familiar to persons skilled in the art. Furthermore, other forms of current mirrors can replace the particular forms herein used by way of explanation. It is also contemplated that current steering need not be achieved by conventional differentially coupled pairs, though these have the advantage of simplicity, but it may also be performed by other circuits which can split an input current into two components having a variable ratio. These and like changes are contemplated to be within the scope of the invention as defined by the claims following.

What is claimed is:

1. In a television receiver, a combination comprising:
   a radio-frequency amplifier for receiving a television signal having a radio-frequency picture carrier wave with an amplitude-modulation sideband and having a radio-frequency sound carrier wave with frequency-modulation sidebands, said radio-frequency amplifier being gain-controlled responsive to a respective control signal;
   a downconverter for generating an intermediate-frequency response to said television signal;
   first, second, third and fourth gain-controlled amplifiers each exhibiting a respective voltage gain adjustable in response to a respective control signal thereof, said third gain-controlled amplifier being similar to said first gain-controlled amplifier in structure and in gain control characteristics, said fourth gain-controlled amplifier being similar to said second gain-controlled amplifier in structure and in gain control characteristics;
   means for filtering the intermediate-frequency response to said television signal to separate therefrom the intermediate-frequency response to a portion of said television signal comprising the sound carrier wave and its frequency-modulation sidebands;
   a first IF amplifier chain for generating an amplified response to the separated intermediate-frequency response to the portion of said television signal comprising the sound carrier wave and its frequency-modulation sidebands, said first IF amplifier chain comprising said first gain-controlled amplifier followed in cascade connection by said second gain-controlled amplifier;
   means for filtering the intermediate-frequency response to said television signal to separate therefrom the intermediate-frequency response to a portion of said television signal essentially consisting of said picture carrier wave and its amplitude-modulation sideband;
   a second IF amplifier chain for generating an amplified response to the separated intermediate-frequency response to the portion of said television signal essentially consisting of said picture carrier wave and its amplitude-modulation sideband, said second IF amplifier chain comprising said third gain-controlled amplifier followed in cascade connection by said fourth gain-controlled amplifier;
   means for further down-converting the amplified intermediate-frequency response to the portion of said television signal comprising the sound carrier wave and its frequency-modulation sidebands, as supplied from said first IF amplifier chain, to generate a sound intermediate frequency response;
   means for detecting sound-descriptive information contained in the frequency modulation of the sound intermediate frequency response, which means includes
   means for suppressing response of said means for detecting sound-descriptive information to variations in the amplitude of the sound intermediate frequency response;
   a video detector for detecting the amplified intermediate-frequency response to the portions of said television signal essentially consisting of said picture carrier wave and its amplitude-modulation sideband, as supplied from said second IF amplifier chain, to generate a video signal including synchronizing pulses;
   an AGC detector for detecting the peaks of the synchronizing pulses included in said video signal to develop an automatic gain control signal;
   means for applying said automatic gain control signal to said second and fourth gain-controlled amplifiers as their said respective control signals, so said respective control signals of said second and fourth gain-controlled amplifiers are the same as each other;
   means for delaying said automatic gain control signal in similar amounts as applied to said first and third gain-controlled amplifiers as their said respective control signals, so said respective control signals of said first and third gain-controlled amplifiers are the same as each other; and
   means for delaying said automatic gain control signal for application to said RF amplifier as its said respective control signal.

2. A combination as set forth in claim 1, wherein said first IF amplifier chain and said IF amplifier chain are constructed within the confines of a monolithic integrated circuit together with said means for further down-converting and said video detector.

3. In a television receiver, a combination comprising:
   a radio-frequency amplifier for receiving a television signal having a radio-frequency picture carrier wave with an amplitude-modulation sideband and having a radio-frequency sound carrier wave with frequency-modulation sidebands, said radio-frequency amplifier being gain-controlled responsive to a respective control signal;
   a downconverter for generating an intermediate-frequency response to said television signal;
   first, second, third and fourth gain-controlled amplifiers each exhibiting a respective voltage gain adjustable in response to a respective control signal thereof, said third gain-controlled amplifier being similar to said first gain-controlled amplifier in structure and in gain control characteristics, said fourth gain-controlled amplifier being similar to said second gain-controlled amplifier in structure and in gain control characteristics;
   a first fixed-gain voltage amplifier connected in cascade connection after said second gain-controlled amplifier;
   a second fixed-gain voltage amplifier connected in cascade connection after said fourth gain-controlled amplifier, said first and second fixed-gain voltage amplifiers each exhibiting substantially the same voltage gain of at least tenfold;
   means for filtering the intermediate-frequency response to said television signal to separate therefrom the intermediate-frequency response to a portion of said television signal comprising the sound carrier wave and its frequency-modulation sidebands;
   a first IF amplifier chain for generating an amplified response to the separated intermediate-frequency response to the portion of said television signal comprising the sound carrier wave and its frequency-modulation sidebands, said first IF amplifier chain comprising said first gain-controlled amplifier followed in cascade connection by said second gain-controlled amplifier and said first fixed-gain voltage amplifier;

means for filtering the intermediate-frequency response to said television signal to separate therefrom the intermediate-frequency response to a portion of said television signal essentially consisting of said picture carrier wave and its amplitude-modulation sideband;

a second IF amplifier chain for generating an amplified response to the separated intermediate-frequency response to the portion of said television signal essentially consisting of said picture carrier wave and its amplitude-modulation sideband, said second IF amplifier chain comprising said third gain-controlled amplifier followed in cascade connection by said fourth gain-controlled amplifier and said second fixed-gain voltage amplifier;

means for further down-converting the amplified intermediate-frequency response to the portion of said television signal comprising the sound carrier wave and its frequency-modulation sidebands, as supplied from said first IF amplifier chain, to generate a sound intermediate frequency response;

means for detecting sound-descriptive information contained in the frequency modulation of the sound intermediate frequency response, which means includes means for suppressing response of said means for detecting sound-descriptive information to variations in the amplitude of the sound intermediate frequency response;

a video detector for detecting the amplified intermediate-frequency response to the portions of said television signal essentially consisting of said picture carrier wave and its amplitude-modulation sideband, as supplied from said second IF amplifier chain, to generate a video signal including synchronizing pulses;

an AGC detector for detecting the peaks of the synchronizing pulses included in said video signal to develop an automatic gain control signal;

means for applying said automatic gain control signal to said second and fourth gain-controlled amplifiers as their said respective control signals, so said respective control signals of said second and fourth gain-controlled amplifiers are the same the same as each other;

means for delaying said automatic gain control signal in similar amounts as applied to said first and third gain-controlled amplifiers as their said respective control signals, so said respective control signals of said first and third gain-controlled amplifiers are the same the same as each other; and means for delaying said automatic gain control signal for application to said RF amplifier as its said respective control signal.

4. A combination as set forth in claim 3, wherein said first IF amplifier chain and said second IF amplifier chain are constructed within the confines of a monolithic integrated circuit together with said means for further down-converting and said video detector.

5. A combination as set forth in claim 1 or 3 in an intercarrier sound television receiver, wherein said means for filtering the intermediate-frequency response to said television signal to separate therefrom the intermediate-frequency response to the portion of said television signal comprising the sound carrier wave and its frequency-modulation sidebands consists of:

means for filtering the intermediate-frequency response to said television signal to separate therefrom the intermediate-frequency response to a portion of said television signal comprising the picture carrier wave as well as the sound carrier wave and its frequency-modulation sidebands, responsive to which said first IF amplifier chain supplies amplified intermediate-frequency response to the portion of said television signal comprising the picture carrier wave as well as the sound carrier wave and its frequency-modulation sidebands; and wherein said means for further down-converting the amplified intermediate-frequency response to the portion of said television signal comprising the sound carrier wave and its frequency-modulation sidebands to generate a sound intermediate frequency response consists of:

means, responsive to the amplified intermediate-frequency response to the portion of said television signal comprising the picture carrier wave as well as the sound carrier wave and its frequency-modulation sidebands, for mixing the picture carrier wave portion thereof with the sound carrier wave and its frequency-modulation sidebands portion thereof to generate a sound intermediate frequency response of intercarrier type.

6. A combination as set forth in claim 5 wherein said means for filtering the intermediate-frequency response to said television signal to separate therefrom the intermediate-frequency response to the portion of said television signal comprising the picture carrier wave as well as the sound carrier wave and its frequency-modulation sidebands comprises a first surface acoustic wave filter.

7. A combination as set forth in claim 6, wherein said first surface acoustic wave filter exhibits a frequency response having minimum attenuation over a first range of frequencies including the sound carrier wave and its frequency-modulation sidebands as translated to intermediate frequencies and over a second range of frequencies including at least on a shoulder thereof the picture carrier wave as translated to an intermediate frequency, having maximum attenuation for first-adjacent-channel sound carrier and its frequency-modulation sidebands as translated to intermediate frequencies, and having attenuation for second-adjacent-channel picture carrier and its amplitude-modulation sidebands as translated to intermediate frequencies.

8. A combination as set forth in claim 7, wherein the frequency response of said first surface acoustic wave filter exhibits attenuation for frequencies between said first and second ranges.

9. A combination as set forth in claim 6 wherein said means for filtering the intermediate-frequency response to said television signal to separate therefrom the intermediate-frequency response to the portion of said television signal essentially consisting of said picture carrier wave and its amplitude-modulation sideband comprises a second surface acoustic wave filter.

10. In combination:
first and second terminals for receiving an operating supply potential therebetween;

detection circuitry having an input connection and having an output connection for supplying an automatic gain control voltage;

first and second amplifier chains of similar construction and operating characteristics, which amplifier chains have respective balanced input connections and respective balanced output connections and are connected for responding similarly to said automatic gain control voltage; and means for applying signal appearing at the balanced output connection of said first amplifier chain to the input connection of said detection circuitry for supplying an automatic gain control voltage—said first amplifier chain comprising:

first means for dividing said operating supply potential received between said first and second terminals, said first means for dividing said operating supply potential comprising a first voltage dropping element having a first end connected to said first terminal and having a second end at which a first intermediate voltage is provided responsive to said operating supply potential being received between said first and second terminals, a second voltage dropping element haivng a first end connected to the second end of said first voltage dropping element and having a second end at which a second intermediate voltage is provided responsive to said operating supply potential being received between said first and second terminals, and means for conducting a direct bias current between the second end of said second voltage dropping element and said second terminal responsive to said operating supply potential being received between said first and second terminals;

a first voltage follower, responsive to voltage supplied to an input connection thereof from said first means for dividing said operating supply potential, for supplying from an output connection thereof a voltage equal to said second intermediate voltage;

a first resistive element having a first end at the output connection of said first voltage follower and having a second end;

means responsive to said automatic gain control voltage approaching the voltage at said first terminal more closely than said second intermediate voltage for causing current flow through said first resistive element via its second end;

first and second gain-controlled amplifiers each exhibiting a respective voltage gain between a respective balanced input connection and respective balanced output connection thereof, which respective voltage gain is adjustable in response to a respective control signal differentially applied between first and second control connections thereof, said first gain-controlled amplifier having voltage at the second end of said first resistive element applied to its first control connection and having said first intermediate voltage applied to its second control connection, said second gain-controlled amplifier having voltage at the second end of said first resistive element applied to its first control connection and having said second intermediate voltage applied to its second control connection; and means for direct coupling the balanced output connection of said first gain-controlled amplifier to the balanced input connection of said second gain-controlled amplifier.

11. A combination as set forth in claim 10, said second amplifier chain comprising:

second means for dividing said operating supply potential received between said first and second terminals, said second means for dividing said operating supply potential comprising a third voltage dropping element having a first end connected to said first terminal and having a second end at which a third intermediate potential is provided responsive to said operating supply potential being received between said first and second terminals, a fourth voltage dropping element having a first end connected to the second end of said third voltage dropping element and having a second end at which a fourth intermediate potential is provided responsive to said operating supply potential being received between said first and second terminals, and means for conducting a direct bias current between the second end of said fourth voltage dropping element and said second terminal responsive to said operating supply potential being received between said first and second terminals;

a second voltage follower, responsive to voltage supplied to an input connection thereof from said second means for dividing said operating supply potential, for supplying from an output connection thereof a voltage equal to said fourth intermediate voltage;

a second resistive element having a first end at the output connection of said second voltage follower and having a second end;

means responsive to said automatic gain control voltage approaching the voltage at said first terminal more closely than said second intermediate voltage for causing current flow through said second resistive element via its second end;

third and fourth gain-controlled amplifiers each exhibiting a respective voltage gain between a respective balanced input connection and respective balanced output connection thereof, which respective voltage gain is adjustable in response to a respective control signal differentially applied between first and second control connections thereof, said first gain-controlled amplifier having voltage at the second end of said second resistive element applied to its first control connection and having said third intermediate potential applied to its second control connection, said fourth gain-controlled amplifier having voltage at the second end of said second resistive element applied to its first control connection and having said fourth intermediate potential applied to its second control connection; and means for direct coupling the balanced output connection of said third gain-controlled amplifier to the balanced input connection of said fourth gain-controlled amplifier.

12. A combination as set forth in claim 11, further including:

a frequency converter for generating at an output thereof a converted frequency signal responsive to signal received at an input thereof;

a first filter supplying a first filtered response to said converted frequency signal to said first amplifier chain as a respective input signal thereto; and a second filter supplying a second filtered response to said converted frequency signal to said second amplifier chain as a respective input signal thereto.

13. A combination as set forth in claim 12, wherein said second and fourth intermediate potentials have the same nominal design value, and wherein said fourth controlled-gain voltage amplifier is similar to said second controlled-gain voltage amplifier in construction and in operating characteristics.

14. A combination as set forth in claim 13, wherein said first and third intermediate potentials have the same nominal design value, and wherein said third controlled-gain voltage amplifier is similar to said first controlled-gain voltage amplifier in construction and in operating characteristics.

15. A combination as set forth in claim 11, wherein said second and fourth intermediate potentials have the same nominal design value, and wherein said fourth controlled-gain voltage amplifier is similar to said second controlled-gain voltage amplifier in construction and in operating characteristics.

16. A combination as set forth in claim 15, wherein said first and third intermediate potentials have the same nominal design value, and wherein said third controlled-gain voltage amplifier is similar to said first controlled-gain voltage amplifier in construction and in operating characteristics.

17. A combination as set forth in claim 11, including:
an overload detector having an input connection and having an output connection for supplying an overload detector voltage;
means for applying signal appearing at the balanced output connection of said second amplifier chain to the input connection of said overload detector; and
means responsive to said overload detector voltage approaching the voltage at said first terminal more closely than said second intermediate voltage for causing current flow through said second resistive element via its second end.

18. A combination as set forth in claim 10 wherein said first amplifier chain further comprises a first fixed-gain voltage amplifier connected in cascade connection after said second gain-controlled amplifier, and wherein said second amplifier chain further comprises a second fixed-gain voltage amplifier connected in cascade connection after said fourth gain-controlled amplifier said first and second fixed-gain voltage amplifiers each exhibiting substantially the same voltage gain of at least tenfold.

* * * * *